US00RE37309B1

(19) United States
(12) Reissued Patent
Nakashima et al.

(10) Patent Number: US RE37,309 E
(45) Date of Reissued Patent: Aug. 7, 2001

(54) SCANNING EXPOSURE APPARATUS

(75) Inventors: Toshiharu Nakashima, Kawasaki; Masato Hamatani, Kohnosu; Ken Ozawa, Tokyo, all of (JP)

(73) Assignee: Nikon Corporation, Tokyo (JP)

(21) Appl. No.: 09/112,380

(22) Filed: Jul. 9, 1998

Related U.S. Patent Documents

Reissue of:
(64) Patent No.: 5,534,970
Issued: Jul. 9, 1996
Appl. No.: 08/255,927
Filed: Jun. 7, 1994

(30) Foreign Application Priority Data

Jun. 11, 1993 (JP) ..... 5-141016
Nov. 19, 1993 (JP) ..... 5-290478

(51) Int. Cl.[7] ..... G02B 27/00
(52) U.S. Cl. ..... 355/53; 355/67; 355/71; 353/122; 359/589; 359/622
(58) Field of Search ..... 355/53, 67, 71; 359/589, 622, 619, 370; 353/122

(56) References Cited

U.S. PATENT DOCUMENTS 4,619,508 * 10/1986 Shibuya et al. ..... 353/122
4,747,678 * 5/1988 Shafer et al. ..... 359/366
4,777,374 * 10/1988 Nakata et al. ..... 250/548
4,924,257 * 5/1990 Jain ..... 355/53
5,048,926 * 9/1991 Tanimoto ..... 359/487
5,194,893 * 3/1993 Nishi ..... 355/53
5,253,110 * 10/1993 Ichihara et al. ..... 359/619
5,307,207 * 4/1994 Ichihara ..... 359/622
5,463,497 * 10/1995 Muraki et al. ..... 359/618
5,473,410 12/1995 Nishi ..... 355/53

FOREIGN PATENT DOCUMENTS 1-259533 * 10/1989 (JP) .

* cited by examiner

*Primary Examiner*—Alan A. Mathews
(74) *Attorney, Agent, or Firm*—Miles & Stockbridge P.C.

(57) ABSTRACT

A projection exposure apparatus for transferring a pattern formed on a mask onto a photosensitive substrate by a scanning exposure method, includes a light source for generating a light beam having a predetermined spatial coherence, an illumination optical system for receiving the light beam from the light source and illuminating a local area on the mask with the light beam, and a device for synchronously moving the mask and the photosensitive substrate so as to transfer the pattern on the mask onto the photosensitive substrate. A direction, corresponding to a higher spatial coherence of the light beam, is made to coincide with the direction of relative scanning an illumination area and the mask in the illumination area.

60 Claims, 10 Drawing Sheets

SCANNING EXPOSURE APPARATUS

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to a scanning exposure apparatus, used in a photolithography process in the manufacture of, e.g., a semiconductor element, a liquid crystal display element, a thin-film magnetic head, or the like, for transferring a pattern on a mask onto a substrate by synchronously moving the mask (or reticle) and the substrate and, more particularly, to a scanning exposure apparatus suited for a case wherein light having a high spatial coherency (e.g., harmonics of a KrF or ArF excimer laser, YAG laser, or the like) is used.

2. Related Background Art

In the photolithography process for the manufacture of semiconductor elements, a reduction projection exposure apparatus (stepper) adopting a step-and-repeat method for transferring a pattern on a mask or reticle (to be generally referred to as a "reticle" hereinafter) onto a semiconductor wafer coated with a photosensitive material (photoresist) via a projection optical system is used. In a stepper of this type, in order to improve the resolution by decreasing the wavelength of exposure light, it has been proposed to use, as exposure light, laser light in a far (or deep) ultraviolet range, e.g., harmonics or the like of a KrF or ArF excimer laser, a YAG laser, or an argon laser. At present, a stepper using the KrF excimer laser has been put into practical use, and is operating in manufacturing lines.

Laser light generally has a high spatial coherency (coherence) and forms a speckle pattern (interference fringes) on a reticle. As a result evenness of the illuminance on the reticle and wafer is impaired. In view of this, problem as disclosed in, e.g., U.S. Pat. No. 4,619,508 and Japanese Laid-Open Patent Application No. 1-259533 (corresponding to U.S. Pat. No. 5,307,207 (Mar. 13, 1989)), a pivot mirror is arranged at the light source side of a fly-eye lens in an illumination optical system to change the incident angle of laser light onto the fly-eye lens for every one to several pulses. With this arrangement, the interference fringes sequentially move on the reticle during exposure. Therefore, the evenness of the illuminance on the reticle or wafer, i.e., the evenness of the exposure amount, can be improved.

Recently, it is required to widen the image field of the projection optical system and to improve its resolution in correspondence with an increase in size and a decrease in line width of semiconductor elements. However, it is very difficult in terms of design and manufacture to realize both the high resolution and wide field of the projection optical system. Under the circumstances, a scanning exposure apparatus as disclosed in, e.g., U.S. Pat. Nos. 4,747,678, 4,924,257, and 5,194,893 has been the subject of much attention. In such an apparatus, a pattern on a reticle is transferred onto a wafer by illuminating only a local area on the reticle with light and synchronously moving the reticle and wafer. The scanning exposure apparatus can transfer a large-area pattern image onto the wafer even if the image field of the projection optical system is small, and can relatively easily improve the resolution of the projection optical system.

In the scanning exposure apparatus, since the reticle and wafer are synchronously scanned, the relationship between the moving amount (pitch) of the reticle and wafer and the pitch (in the scanning direction) of interference fringes in the illumination area between pulse emissions changes depending upon the scanning speed of the stage (i.e., an optimal exposure amount of the wafer). Therefore, when the scanning exposure apparatus uses light having a high spatial coherency as exposure light, it is difficult to reduce exposure amount unevenness caused by interference fringes even when the above-mentioned pivot mirror is used.

SUMMARY OF THE INVENTION

It is an object of the present invention to provide a scanning exposure apparatus which can minimize exposure amount unevenness on a photosensitive substrate due to interference fringes, even when light having a high spatial coherency is used as exposure light.

A first scanning exposure apparatus according to the present invention comprises a light source for emitting a light beam having a predetermined spatial coherence, an illumination optical system for illuminating a local area on a mask with the light beam, and a device for synchronously moving the mask and a photosensitive substrate to transfer a pattern formed on the mask onto the photosensitive substrate, wherein a direction with higher spatial coherence of the light beam (i.e. a direction in which spatial coherence of the light beam is high) substantially coincides with the scanning direction of the mask with respect to the illumination area in the illumination area on the mask.

According to the first apparatus of the present invention, the direction in which the spatial coherence (degree of coherence) of the light beam is high is measured in advance in a plane perpendicular to the optical axis of the illumination optical system for guiding the light beam from the light source to the mask, and the direction with a higher spatial coherence is made to coincide with the scanning direction of the mask in the illumination area. Therefore, as shown in, e.g., FIG. 4, the illuminance distribution, in the scanning direction (X direction), in the illumination area varies at a predetermined pitch and at a relatively large amplitude, as indicated by a curve 40. On the other hand, the illuminance distribution, in the non-scanning direction (Y direction) perpendicular to the scanning direction, in the illumination area is relatively flat, as indicated by a curve 41. In this case, even when the illuminance distribution (curve 40) largely varies in the scanning direction, since the mask is scanned along the direction corresponding to a higher spatial coherence, exposure amount unevenness in the scanning direction on the photosensitive substrate after scanning exposure is remarkably reduced. Since the illumination distribution (curve 41) in the non-scanning direction is originally flat, to begin with exposure amount unevenness in the non-scanning direction on the photosensitive substrate is also very small. Therefore, even when illuminance evenness is impaired by interference fringes in the illumination area, exposure amount unevenness on the entire surface of the shot area on the photosensitive substrate can be reduced, i.e., the evenness of the exposure amount can be improved.

A second scanning exposure apparatus according to the present invention comprises a light source for emitting pulse light having a predetermined spatial coherence, an illumination optical system for receiving the pulse light and forming a local illumination area on a mask with the pulse light, and a device for synchronously moving the mask and a photosensitive substrate to transfer a pattern formed on the mask onto the photosensitive substrate. The apparatus further comprises an interference fringe moving member for changing a position of interference fringes in the illumination area for every one to several pulses in accordance with a relative scanning speed between the illumination area and the mask and a pitch, in the relative scanning direction, of the interference fringes formed in the illumination area. The second apparatus may also comprise a detector for detecting a spatial coherence of the pulse light, and a controller for controlling the operation of the interference fringe moving member in accordance with the detected spatial coherence.

According to the second apparatus of the present invention, pulse light is used as exposure light. When the pulse light is far ultraviolet laser light, KrF excimer laser light having a wavelength of 248 nm, it is not easy to satisfactorily correct the chrominance aberration of a projection optical system. The pulse light source therefore preferably narrows the wavelength band of the pulse light using a diffraction grating (or etalon), a slit, and the like. For this reason, in FIG. 1, for example, pulse light ($LB_0$) emitted from a light source (1) has a high spatial coherence and a small beam width in the horizontal direction (H direction) but has a low spatial coherence and a large beam width in the vertical direction (V direction). Therefore, the horizontal direction of the pulse light emitted from the light source is set in the scanning direction of the illumination area on the mask.

Note that the ratio between the widths, in the horizontal and vertical directions, of the pulse light from the light source is generally smaller than the ratio between the widths, in the scanning and non-scanning directions, of the illumination area. For this reason, the width, in the horizontal direction, of the pulse light is increased using two cylindrical lenses (38, 39), as shown in, e.g., FIG. 3. If the divergent angle of incident pulse light ($LB_0$) is represented by $\theta_1$, the focal length of the front-side (light source-side) cylindrical lens 38 is represented by $f_1$, and the focal length of the rear-side (mask-side) cylindrical lens 39 is represented by $f_2$, a divergent angle $\theta_2$ of pulse light (LB) emerging from the cylindrical lens (39) is given by the following equation:

$$\theta_2=(f_1/f_2)\theta_1$$

If $f_1<f_2$ is set to increase the beam width in the horizontal direction, the following relation is satisfied, and the divergent angle $\theta_2$ of the emerging pulse light (LB) decreases:

$$\theta_1>\theta_2$$

Therefore, when the beam width is increased in the horizontal direction, the spatial coherence in the scanning direction (SR direction) of the illumination area further increases, as shown in FIG. 4. For this reason, interference fringes with a high contrast are formed in the scanning direction. Since the contrast, in the non-scanning direction, of the interference fringes is low, illuminance unevenness in the non-scanning direction becomes sufficiently small.

The illuminance distribution in the scanning direction of the illumination area is as indicated by, e.g., a curve 40 in FIG. 5A. Therefore, when the scanning direction of the mask (and the photosensitive substrate) is selected in this direction, waves of various phases are superposed on the photosensitive substrate due to relative movement between the interference fringes and the mask by scanning, as shown in FIG. 5B, whereby exposure amount unevenness caused by the interference fringes can be remarkably reduced by the accumulation effect.

Depending on the scanning speed, the pulse emission timing may substantially coincide with the phase of the interference fringes, i.e., the moving amount of the mask between pulse emissions may substantially coincide with the pitch of the interference fringes. For this reason, at a given illumination point on the mask, pulse emissions may occur in the order of positions 40C, 40F, . . . in FIG. 5A, and at another illumination point, pulse emissions may occur in the order of positions 40B, 40E, . . . . Therefore, the accumulation effect cannot always be expected at every point on the mask, and exposure amount unevenness may not necessarily.

In order to avoid this, at the scanning speed for performing pulse emissions at positions 40C, 40F, and 40I in FIG. 5A, the interference fringes may be laterally shifted by $\delta A$ upon pulse emission at the position 40F and by $\delta B$ upon pulse emission at the position 40I using, e.g., a pivot mirror. Then, respective points in the pattern area on the mask are equally divided in correspondence with the numbers of pulses of curves 40 (solid curve), 42 (dotted curve), and 43 (alternate long and short dashed curve) in FIG. 5B, and are irradiated with a plurality of pulse light components corresponding to different phases of interference fringes. As a result exposure amount unevenness can be remarkably reduced by the accumulation effect. In other words, the accumulated exposure amount on the shot area on the photosensitive substrate becomes almost even on the entire surface. Note that illuminance unevenness in the scanning direction is reduced by controlling the operation of the interference fringe moving member, so that the phases in the scanning direction on the curve 40 are respectively given by 0, $2m\pi+(2\pi/n)$, $4m\pi+(4\pi/n)$, $6m\pi+(6\pi/n)$, . . . , $2(n-1)m\pi+2(n-1)\pi/n)$, . . . (where n and m are integers) for the pulse emissions at an arbitrary radiation point on the mask.

A third scanning exposure apparatus according to the present invention, comprises a light source for emitting pulse light having a predetermined spatial coherency, an optical integrator for receiving the pulse light and forming a plurality of light source images, an optical system for focusing light components from the plurality of light source images and forming illuminating a local area on a mask with the focused light components, and a device for synchronously moving the mask and a photosensitive substrate to transfer a pattern formed on the mask onto the photosensitive substrate. The apparatus further comprises a variable phase member for shifting (the phase of) interference fringes formed in the illumination area along a direction of relative scanning between the illumination area and the mask. The contrast of the accumulated light amount distribution on the mask or the photosensitive substrate after radiation of the plurality of pulse light components is set to be equal to or smaller than a predetermined allowable value by phase modulation by a length obtained by adding the moving amount of the interference fringes upon relative scanning between the illumination area and the mask between pulse emissions, and the shift amount of the interference fringes in the relative scanning direction by the variable phase member between pulse emissions. It is preferable that the variable phase member be allowed to also move the interference fringes in a direction perpendicular to the above-mentioned relative scanning direction.

According to the third apparatus of the present invention, the moving amount of the interference fringes in the relative scanning direction by the variable phase member is determined in units of, e.g., one to several pulses, in accordance with the scanning speed of the mask (and the photosensitive substrate) and a proper exposure amount of the photosensitive substrate. In this case, the moving amount of the interference fringes in the relative scanning direction by the variable phase member is determined in accordance with the relationship between the "pitch of interference fringes formed in the illumination area" and the "relative scanning speed of the illumination area and the mask", so that the contrast (residual contrast) of the accumulated light amount distribution on the photosensitive substrate after radiation of the plurality of pulse light components becomes equal to or smaller than the predetermined allowable value. Therefore, even when the relationship between the pitch of the interference fringes and the relative scanning speed changes upon a change in proper exposure amount of the photosensitive substrate, the residual contrast will never become larger than the allowable value to unduly impair exposure amount evenness.

When a one-dimensional pivot mirror (e.g., a polygonal mirror or a galvano mirror) for moving the interference fringes in only the scanning direction is used as the variable phase member, the pivot control of the pivot mirror can be realized by simple reciprocal motion if the direction (sign) of the moving amount in the relative scanning direction of the interference scanning is taken into consideration. Furthermore, when a pivot mirror which can two-dimensionally oscillate is used as the variable phase member to move the interference fringes in the illumination area additionally in the non-scanning direction perpendicular to the relative scanning direction, exposure amount unevenness in the non-scanning direction can also be reduced.

DESCRIPTION OF THE PREFERRED EMBODIMENTS

The first embodiment of the present invention will be described below with reference to FIG. 1 to FIGS. 6A and 6B. In this embodiment, the present invention is applied to a step-and-scan type scanning exposure apparatus which comprises a pulse oscillation type laser light source.

Figure 1:
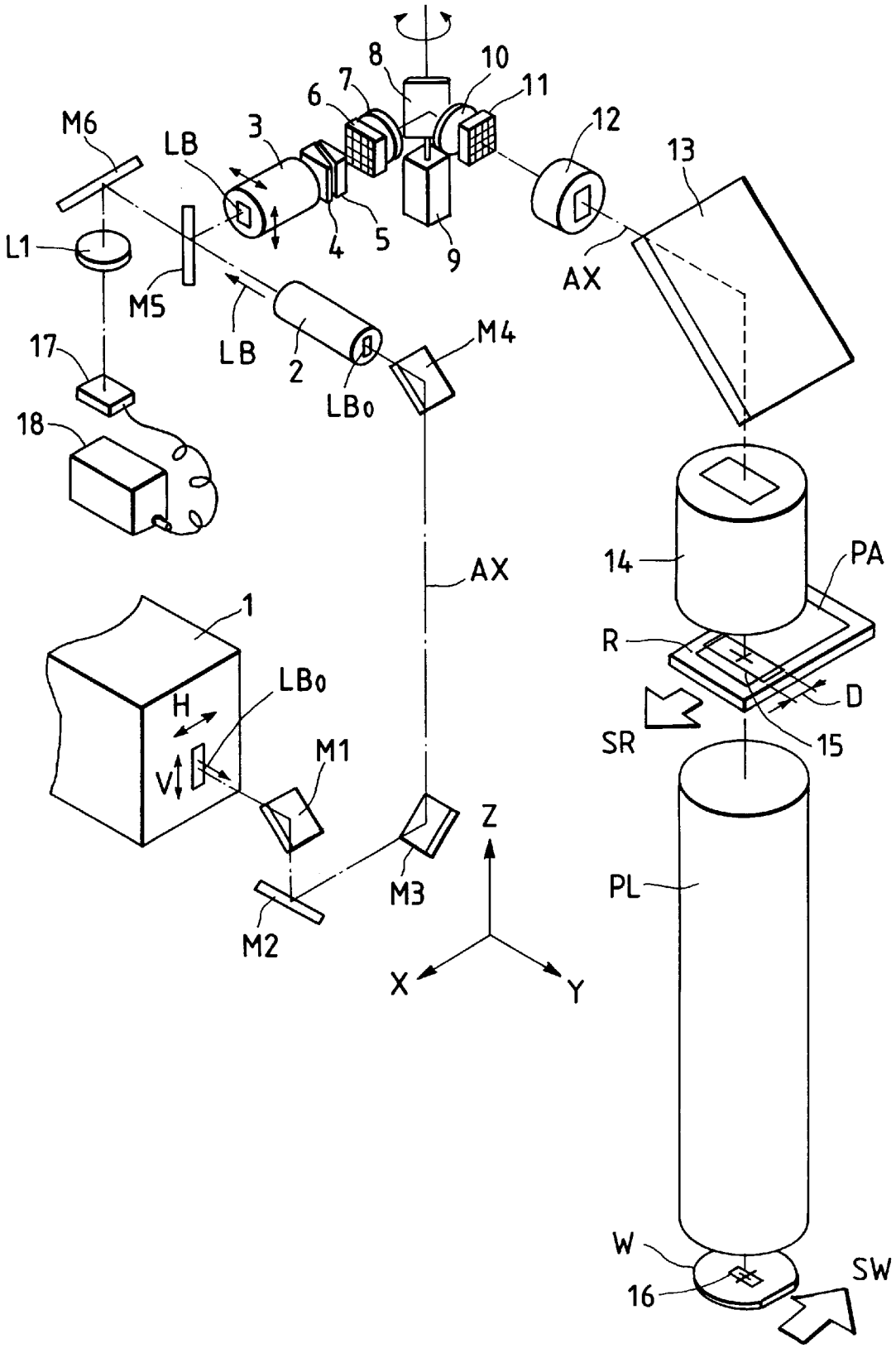
FIG. 1 is a perspective view showing the arrangement of a projection exposure apparatus according to the first embodiment of the present invention.

Referring to FIG. 1, a laser beam $LB_0$ in a far ultraviolet range (e.g., a wavelength of 248 nm) emitted from an excimer laser light source 1 is incident on a beam shaping optical system 2, including cylindrical lenses, via mirrors M1, M2, M3, and M4. The sectional shape of the laser beam $LB_0$ emitted from the excimer laser light source 1 is an elongated rectangular shape in which the dimension in the horizontal direction (H direction) is considerably smaller than that in the vertical direction (V direction). The beam shaping optical system 2 expands the dimension in the horizontal direction of the laser beam $LB_0$, and outputs a laser beam LB with a sectional shape having substantially the same aspect ratio (almost similar shape) as that of an illumination area 15 (to be described later).

Figure 3:
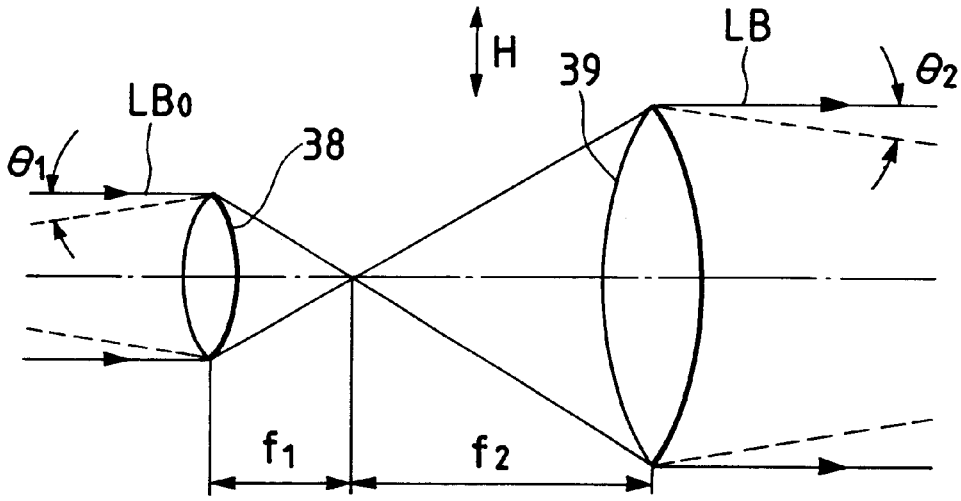
FIG. 3 is a view showing an example of the arrangement of a beam shaping optical system in FIG. 1.

FIG. 3 shows an example of the detailed arrangement of the beam shaping optical system 2. Referring to FIG. 3, the laser beam $LB_0$ from the light source 1 is transmitted through a cylindrical lens 38 having a focal length $f_1$ and a cylindrical lens 39 having a focal length $f_2$ ($f_2>f_1$), so that the dimension in the horizontal direction of the sectional shape is expanded to $f_2/f_1$ times. If the divergent angle of the laser beam $LB_0$ incident on the cylindrical lens 38 is represented by $\theta_1$, a divergent angle $\theta_2$ of the laser beam LB emerging from the cylindrical lens 39 is decreased to $f_1/f_2$ of the divergent angle $\theta_1$. In general, since the spatial coherence of a light beam becomes higher as the divergent angle is smaller, the spatial coherence, in the horizontal direction (H direction) of the laser beam LB becomes higher than that of the laser beam $LB_0$.

Referring back to FIG. 1, the laser beam LB emerging from the beam shaping optical system 2 is reflected by a mirror M5 and is incident on a beam expander (or zoom lens) 3, so that its sectional size is expanded to a predetermined value. The collimated laser beam LB emerging from the beam expander 3 is incident on a crystal prism (polarization member) 4 and is split into two orthogonal polarized light components. The two polarized light components emerging from the crystal prism 4 are incident on a quartz glass prism 5 for optical path correction, and their beam propagation directions are corrected. Furthermore, the laser beams of the two polarized light components are deflected by a pivot mirror 8 via a first fly-eye lens 6 and a relay lens 7. The pivot mirror 8 scans, using a driver 9, the laser beams in a predetermined angle range on the horizontal plane by an appropriate control method.

The laser beams scanned by the pivot mirror 8 are incident on a second fly-eye lens 11 via a relay lens 10, and form a large number of tertiary light sources on the focal plane at the exit side of the fly-eye lens 11. Laser beams from the large number of tertiary light sources are focused by a focusing lens 12, are reflected by a mirror 13, and are then incident on a condenser lens 14. The laser beams from the large number of tertiary light sources are radiated by the condenser lens 14 to be superposed on the rectangular illumination area 15, having a dimension D in a short-side direction, on a reticle R. An image of a pattern in the illumination area 15 is imaged and projected in a rectangular exposure area 16 on a wafer W via a projection optical system PL.

The Z-axis is defined in a direction parallel to the optical axis of the projection optical system PL, the X-axis in the XY plane perpendicular to the optical axis is defined as the short-side direction of the illumination area 15, and the Y-axis is defined as the long-side direction of the illumination area 15. In this embodiment, if the projection magnification of the projection optical system is represented by $\beta$, the wafer W is moved at a constant speed $\beta.V$ in a $-X$ direction (to be referred to as a scanning direction SW hereinafter) in synchronism with movement of the reticle R in the X direction (to be referred to as a scanning direction SR hereinafter) at a constant speed V with respect to the illumination area 15. In this manner, the image of the circuit pattern in a pattern area PA on the reticle R is scanning-exposed on the shot area on the wafer W.

In FIG. 1, in order to check the spatial coherence of excimer laser light, a focusing lens L1 is arranged behind the mirror M6 to focus light leaked from the mirror M5 at the rear-side focal point position of the focusing lens L1, and the focused light is received by a two-dimensional image pickup element (e.g., a CCD) 17 arranged at the focal point position. The divergent angle of a laser beam is measured by processing the image pickup signal from the image pickup element 17 by an image processing system 18. Since the divergent angle of the laser beam is inversely proportional to the spatial coherence, the spatial coherences in the scanning direction SR and the non-scanning direction on the illumination area 15 can be calculated on the basis of the measured divergent angle.

Figure 2:
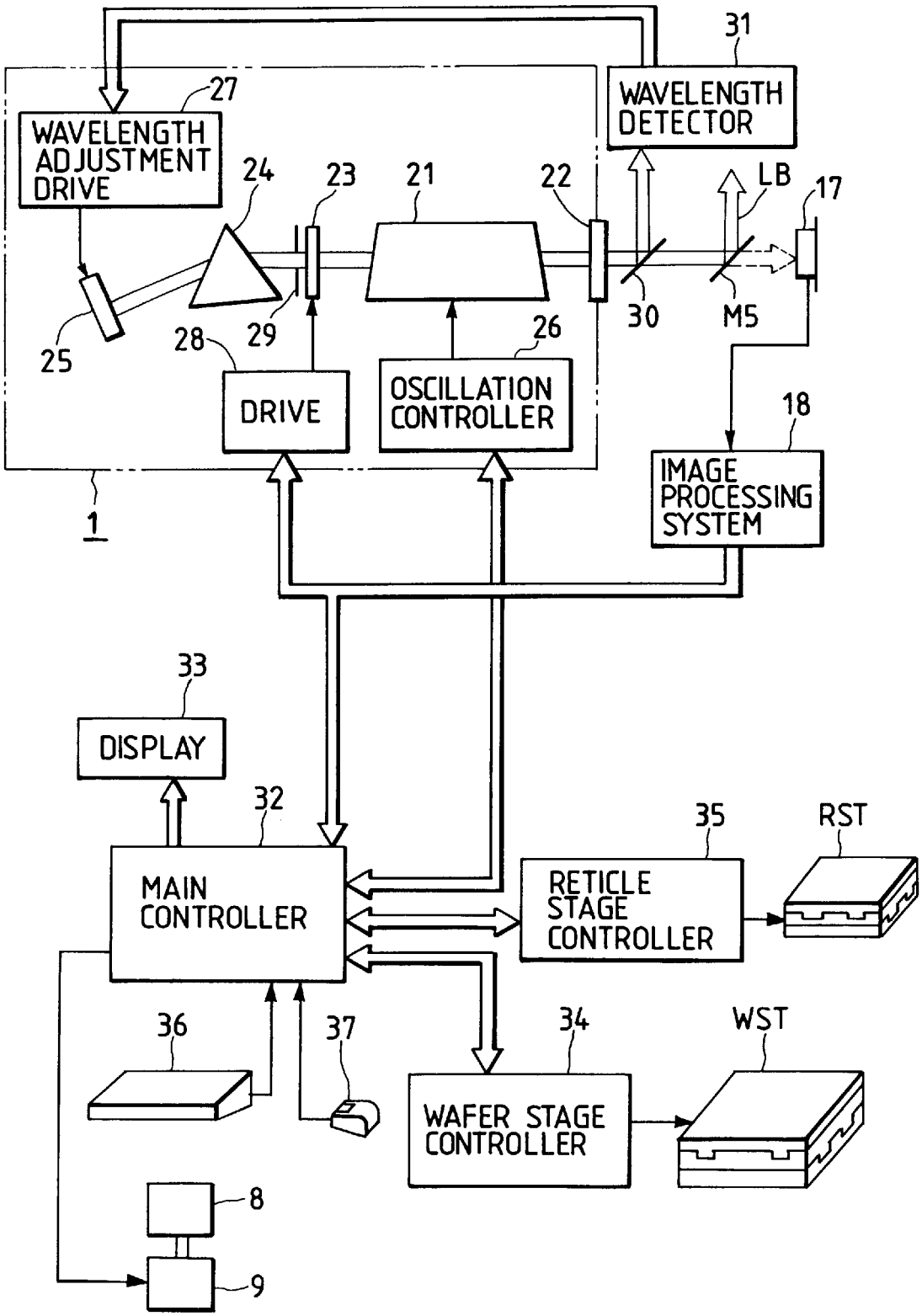
FIG. 2 is a block diagram showing a control system of the projection exposure apparatus shown in FIG. 1.

FIG. 2 shows a control system of the projection exposure apparatus shown in FIG. 1. Referring to FIG. 2, the excimer laser light source 1 includes a laser tube 21 in which a gas mixture serving as a medium of laser oscillation, and oscillation trigger electrodes are sealed, a front mirror 22 having a predetermined reflectance (less than 100%) and constituting a resonator, a rear mirror 23 of the resonator, an aperture plate 29 for wavelength selection, a prism 24 for wavelength selection and wavelength band narrowing, a reflection type diffraction grating 25, and the like. Furthermore, the excimer laser light source 1 includes an oscillation controller 26 for applying a high voltage to the electrodes in the laser tube 21 to perform oscillation, a wavelength adjustment drive unit 27 for adjusting the inclination angle of the diffraction grating 25 so as to always make constant the absolute wavelength of a laser beam to be oscillated, a drive unit 28 for adjusting the inclination of the rear mirror 23, and the like.

Some light components of a laser beam emerging from the front mirror 22 are guided to a wavelength detector (beam splitter or the like) 31 via a beam splitter 30. The wavelength detector 31 detects the wavelength of the laser beam, and supplies the detected wavelength to the wavelength adjustment drive unit 27. The wavelength adjustment drive unit 27 changes the inclination angle of the diffraction grating 25 in accordance with the wavelength detected by the wavelength detector 31, so that the difference between the detected wavelength and a predetermined absolute wavelength becomes equal to or smaller than a prescribed value. A signal corresponding to the beam divergent angle detected by processing the image pickup signal from the image pickup element 17 by the image processing system 18 (more specifically, a signal corresponding to the size of the beam spot formed on the light-receiving surface of the image pickup element 17) is fed back to the drive unit 28 of the rear mirror 23 in the excimer laser light source 1, and is also supplied to a main controller 32 for controlling the operation of the entire apparatus. When the actually measured value of the beam divergent angle is different from a predetermined value beyond an allowable range, the drive unit 28 changes the inclination angle of the rear mirror 23.

A reticle stage RST performs alignment and scanning of the reticle R, and a wafer stage WST performs alignment and scanning of the wafer W. The reticle stage RST scans the reticle R to sequentially change the radiation range on the reticle R on which a 1-chip pattern is formed. The wafer stage WST has both a function of moving the wafer W in the X and Y directions by the step-and-repeat method, and a function of scanning the wafer W in synchronism with the scanning of the reticle R in correspondence with the radiation range on the reticle R, so that a pattern image on the reticle R is exposed on each of a plurality of shot areas on the wafer W.

The main controller 32 controls oscillation of the excimer laser light source 1 via the oscillation controller 26, and controls the operations of the wafer stage WST and the reticle stage RST via a wafer stage controller 34 and a reticle stage controller 35, respectively. Furthermore, the main controller 32 controls the amplitude, cycle, and the like of the pivotal motion of the pivot mirror 8 via the driver 9. The main controller 32 is connected to a keyboard 36 as an input device, a coordinate input device (so-called mouse) 37, a display (CRT display, meter, or the like) 33 as an output device, and the like. The keyboard 36 and the coordinate input device 37 are used for designating, in advance, the number of shots of pulse light for exposing a single shot area on the wafer, and for setting various sequences and parameters.

The main controller 32 receives information of the divergent angle of the laser beam from the excimer laser light source 1 which is executing preliminary oscillation from the image processing system, and determines an oscillation frequency which is optimized to minimize the contrast of interference fringes without lowering the throughput, and the number of pulses of a laser beam to be radiated onto a single shot area on the wafer W. Thereafter, the main controller 32 issues a command to the oscillation controller 26. At the same time, the main controller 32 determines the pivot cycle, amplitude, and phase of the pivot mirror 8, and issues a command to the driver 9. Also, the main controller 32 determines optimal scanning speeds, and issues commands to the reticle and wafer stage controllers 35 and 34.

Next, the arrangement for reducing light amount unevenness on the reticle R and wafer W in this embodiment will be explained. In this embodiment, the spatial coherence of the laser beam $LB_0$ emitted from the excimer laser light source 1 in FIG. 1 is high in the horizontal direction (H direction). Thus, an illumination optical system is constituted, so that a direction with a higher spatial coherence of the laser beam $LB_0$ coincides with the short-side direction of the illumination area 15, i.e., the scanning direction SR. With this arrangement, interference fringes (speckle pattern) formed in the illumination area 15 on the reticle R have a high contrast in the scanning direction SR, and have a low contrast in a non-scanning direction (Y direction) perpendicular to the scanning direction SR.

The interference pattern formed on the reticle R and the wafer W in FIG. 1 includes periodic components corresponding to the arrangement of lens elements of the fly-eye lenses 6 and 11, and has a higher contrast in the scanning direction than that in the non-scanning direction. For this reason, in this embodiment, in order to reduce the contrast of the interference pattern, the laser beam LB is split into laser beams of two polarized light components which define a predetermined angle therebetween, and these laser beams are radiated onto the reticle R. An illuminance distribution (relative value) I(X), in the scanning direction (X direction), on the illumination area 15 with the first polarized light component of the two polarized light components periodically changes at a predetermined pitch, as indicated by a curve 40 in FIG. 6A. An illuminance distribution I(X) based on the second polarized light component is indicated by a curve 44, and the curve 44 is shifted by half a pitch from the curve 40 in the X direction. Thus, the entire illuminance distribution I(X) is expressed by a curve 45 in FIG. 6B, and the variation width of the illuminance distribution is greatly reduced.

Figure 4:
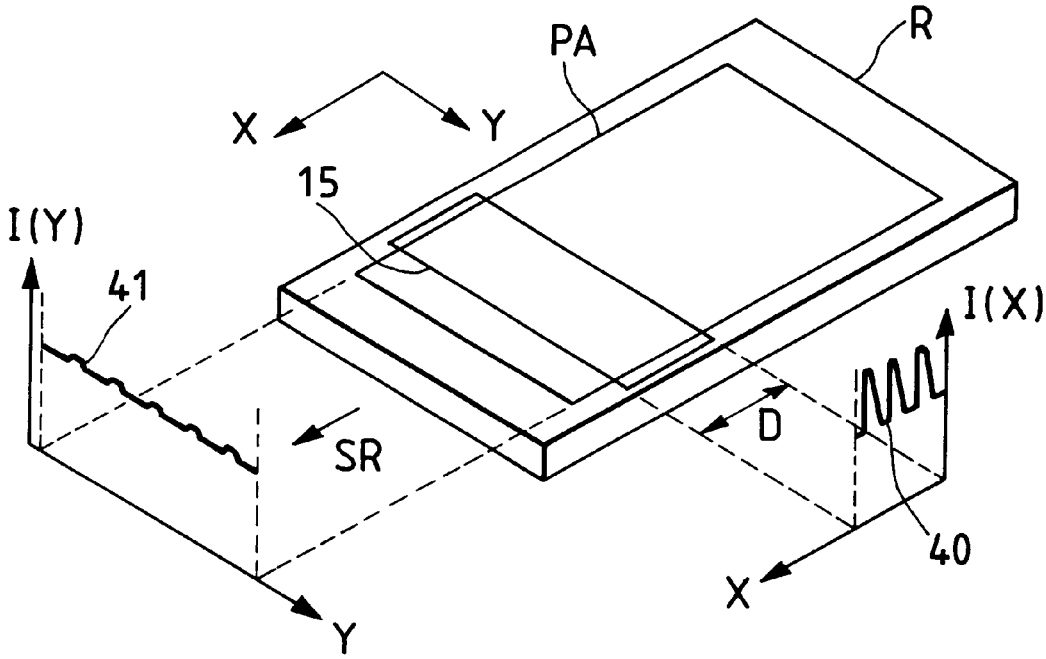
FIG. 4 is a perspective view showing the illuminance distribution of an illumination area on a reticle.

FIG. 4 shows the illuminance distribution of the illumination area 15 on the reticle R. On the reticle R, the illumination area 15 having the dimension D in the scanning direction SR (X direction) is formed. The illuminance distribution I(X), in the X direction, of the illumination area 15 changes at a predetermined pitch and with a relatively large amplitude, as indicated by the curve 40, and the illuminance distribution I(Y), in the Y direction, of the illumination area 15 is almost flat, as indicated by a curve 41. Therefore, light amount unevenness in the non-scanning direction (Y direction) becomes small. In this embodiment, light amount unevenness in the X direction is reduced by scanning the reticle R with respect to the illumination area 15 and by scanning a laser beam by the pivot mirror 8.

Figure 5A:
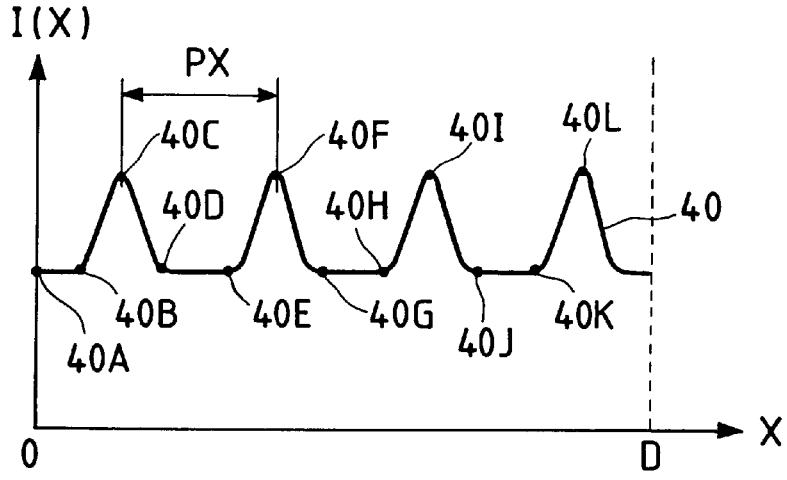
FIG. 5A is a graph showing the illuminance distribution, in the scanning direction, on the illumination area on the reticle.
Figure 5B:
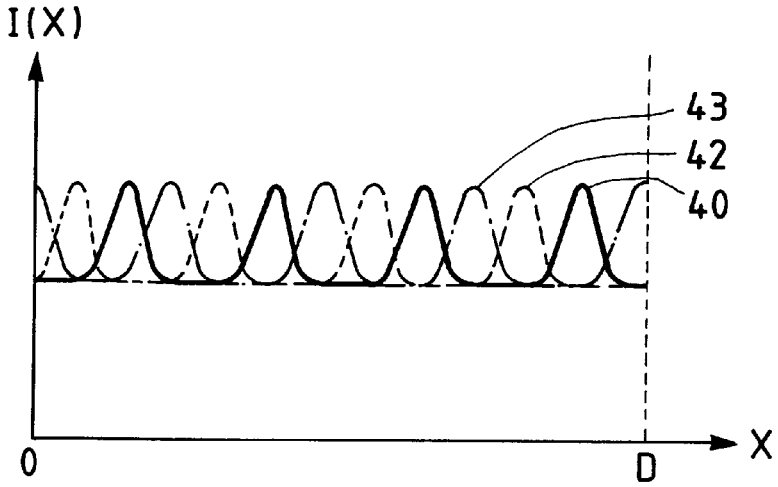
FIGS. 5B and 5C are graphs showing the illumination distribution, in the scanning direction, on the illumination area on the reticle as a result of moving interference fringes.

FIG. 5A shows the curve 40 corresponding to the illuminance distribution I(X), in the scanning direction (X direction) per pulse, on the illumination area 15, and an area from an origin 0 to an X-coordinate position D corresponds to the dimension, in the X direction of the illumination area 15 in FIG. 4. Assume that upon scanning of the reticle R in the X direction with respect to the illumination area 15, respective radiation points on the reticle R move along the X-axis in FIG. 5A (the same applies to FIG. 5B).

In this embodiment, if the pitch of the curve 40 is represented by PX and the number of pulses required for exposure of one shot area, which is calculated based on the energy density per pulse and the resist sensitivity, is represented by n, when a scanning speed which yields a curve having peaks at positions 0, PX/n, 2PX/n, . . . , (n−1)PX/n for n pulse emissions coincides with a predetermined speed (a value V=(D/n)f obtained by dividing the dimension D of the illumination area 15 with the required number n of pulses, and multiplying the product with an oscillation frequency f of the light source 1), accumulated light amount unevenness on the reticle R and the wafer W is most efficiently reduced whether or not the pivot mirror 8 is scanned. Note that the above-mentioned scanning speed need not yield a single curve having peaks in the order of 0, PX/n, 2PX/n, . . . , (n−1)PX/n, but need only yield all curves to provide peaks at these positions in n pulse emissions. Also, in some cases, a curve having peaks at positions obtained by equally dividing the pitch PX by n/2, n/3, . . . need only be obtained.

For example, when the required number n of pulses is 3, the reticle R moves by D/3 in the X direction for each pulse. Then, as shown in FIG. 5A, at a given radiation point (X=0) on the reticle R, pulse light is radiated in the order of positions 40A, 40E, 40I, . . . at intervals D/3. Since the accumulated light amount distribution in the X direction is obtained by superposing pulse light components having the illuminance distributions indicated by the curves 40, 42, and 43 in FIG. 5B, accumulated light amount unevenness becomes very small. The moving distance per pulse of the reticle R is set to be a unit fraction of the dimension D in the scanning direction SR.

However, since the scanning speeds of the reticle R and the wafer W are determined on the basis of a proper exposure amount on the wafer W, and the like, as will be described later, the above-mentioned condition may not always be satisfied. In such a case, the laser beam can be controlled using the pivot mirror 8 to obtain an illuminance distribution having peaks at positions 0, PX/n, 2PX/n, . . . , (n−1)PX/n.

Figure 5C:
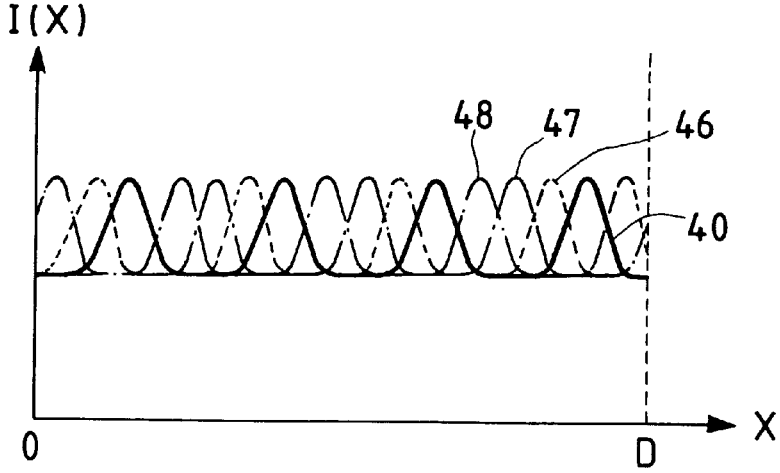
Figure 6A:
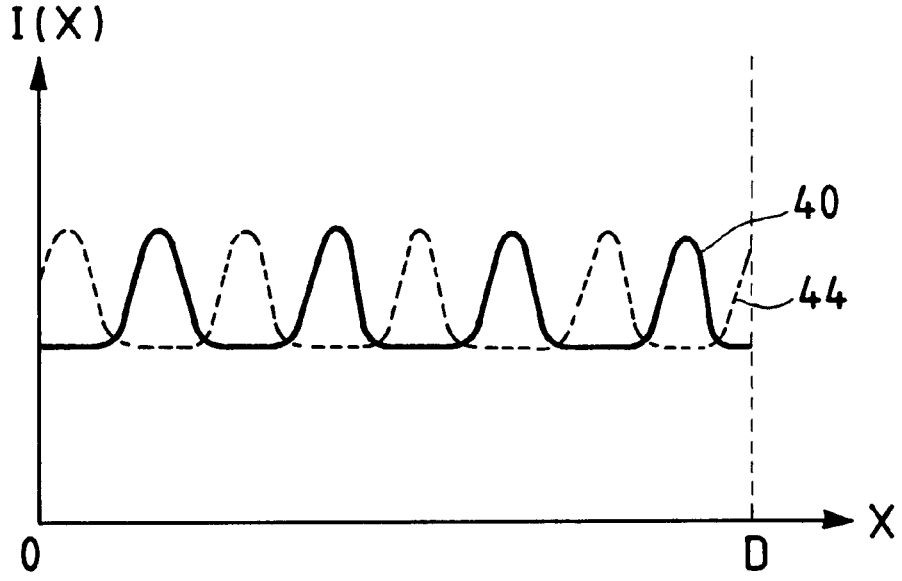
FIG. 6A is a graph showing two illuminance distributions on the illumination area when the illumination area is irradiated with laser beams in two directions.
Figure 6B:
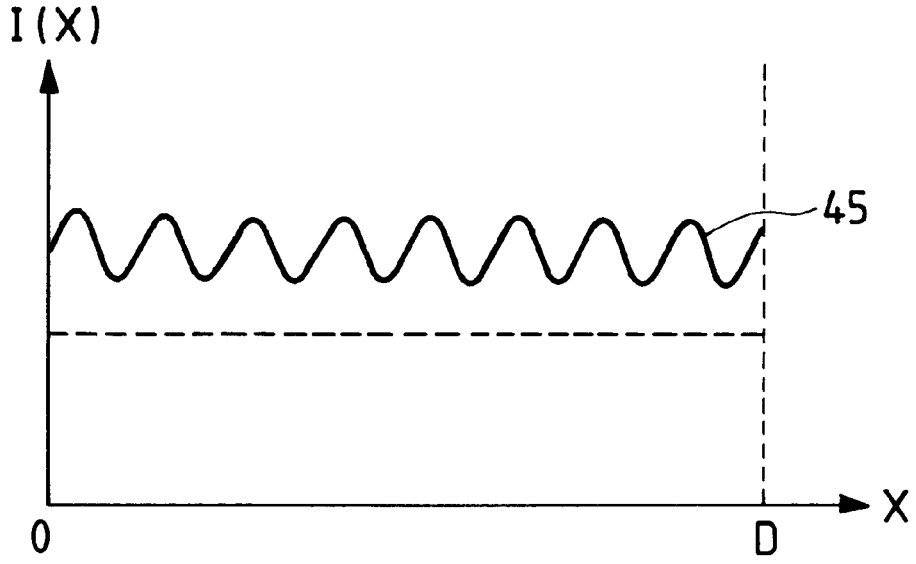
FIG. 6B is a graph showing an illumination distribution as the sum of the two illumination distributions shown in FIG. 6A.

Assume for example, that the required number n of pulses is 4, and the reticle R is moved by D/4 in the X direction for each pulse. Then, as shown in FIG. 5A, at a given radiation point (X=0) on the reticle R, pulse light is radiated in the order of positions 40A, 40D, 40G, 40K, . . . at intervals D/4, and at another given point, e.g., a point separated by D/6 from the position of X=0, pulse light is radiated in the order of positions 40C, 40F, 40I, and 40L. As a result, the accumulated light amount distribution in the X direction is expressed by superposing the curves 40, and light amount unevenness is not reduced at all. Thus, in this case, the pivot mirror 8 is scanned. For example, when the phase of the illuminance distribution (interference fringes) is changed by scanning the pivot mirror 8 by PX/4 at the position 40F, by PX/2 at the position 40I, and by 3PX/4 at the position 40L, the accumulated light amount distribution is expressed by superposing waves with four different phases, as shown in FIG. 5C, and light amount unevenness becomes very small. Curves 46, 47, and 48 in FIG. 5C are obtained by respectively changing the phase of the curve 40 by PX/4, PX/2, and 3PX/4 using the pivot mirror 8.

The scanning speeds of the reticle R and the wafer W will be explained below. The scanning speed of the wafer W is determined based on a proper exposure amount (determined in accordance with the sensitivity characteristics of a resist coated on the wafer W) to be given to the wafer W, and the energy amount per pulse. In the case of the excimer laser light source 1, the energy amount discharged per pulse varies within a range of, e.g., about ±5%. For this reason, the intensity (energy amount) of the laser beam to be incident on the reticle R is attenuated, the number of pulses required for scanning exposure of one shot area is increased, and the energy amount per pulse is determined to decrease the variation in light amount on the wafer W by the accumulation effect.

If the proper exposure amount of the wafer W is represented by E and the energy amount per pulse (average energy amount) is represented by $E_p$, a minimum number of exposure pulses required at a predetermined point on the wafer W is given by $E/E_p$. Since the length (the dimension, in the scanning direction of the illumination area 15), in the scanning direction, of a range which is simultaneously irradiated with light on the reticle R is D, the moving amount per pulse of the reticle R is given by $(E_p/E)D$. Therefore, when the oscillation frequency of the excimer laser light source 1 is f [Hz], a scanning speed V of the reticle R is set to be a value given by the following equation:

$$V=(E_p/E)f.D$$

In this embodiment, the interference pattern in the illumination area 15 is not moved in the non-scanning direction (Y direction in FIG. 4). However, in order to further reduce light amount unevenness in the non-scanning direction, it is desirable that, for example, the pivot mirror 8 in FIG. 1 be arranged to allow two-dimensional pivotal motion so as to scan the interference pattern also in the non-scanning direction. Alternatively, two sets of pivot mirrors may be arranged in the illumination optical system to independently shift the interference pattern in the scanning and non-scanning directions. Also, in order to move the interference pattern in both the scanning direction SR (X direction) and the non-scanning direction (Y direction) in FIG. 4, the interference pattern may be shifted in a direction (e.g., a 45° direction) crossing the X and Y directions.

As the method of causing the direction with a higher spatial coherence to coincide with the scanning direction, the following techniques are also available.

① If the exposure apparatus main body is arranged to be able to scan the reticle and wafer in both the X and Y directions, even after the apparatus main body and the laser light source are connected, one of the X and Y directions corresponding to a higher spatial coherence may be selected as the scanning direction. The shape of the illumination area may be set by, e.g., a reticle blind (field stop), to assure that the selected scanning direction coincides with the short-side direction of the illumination area on the reticle.

② In order to cause a direction corresponding to a higher spatial coherence of laser light from the light source to coincide with the scanning direction, the direction, corresponding to a higher spatial coherence of a laser beam emitted from the light source and incident on the illumination optical system of the exposure apparatus can be adjusted using, e.g., a plurality of mirrors. In this case, the fly-eye lenses and the like must often be adjusted. In general, it is desirable to assemble the apparatus in consideration of the direction corresponding to a higher spatial coherence.

In this embodiment, the interference pattern is moved for each pulse by the pivot mirror 8. Alternatively, the interference pattern may be moved for every several pulses.

Figure 7:
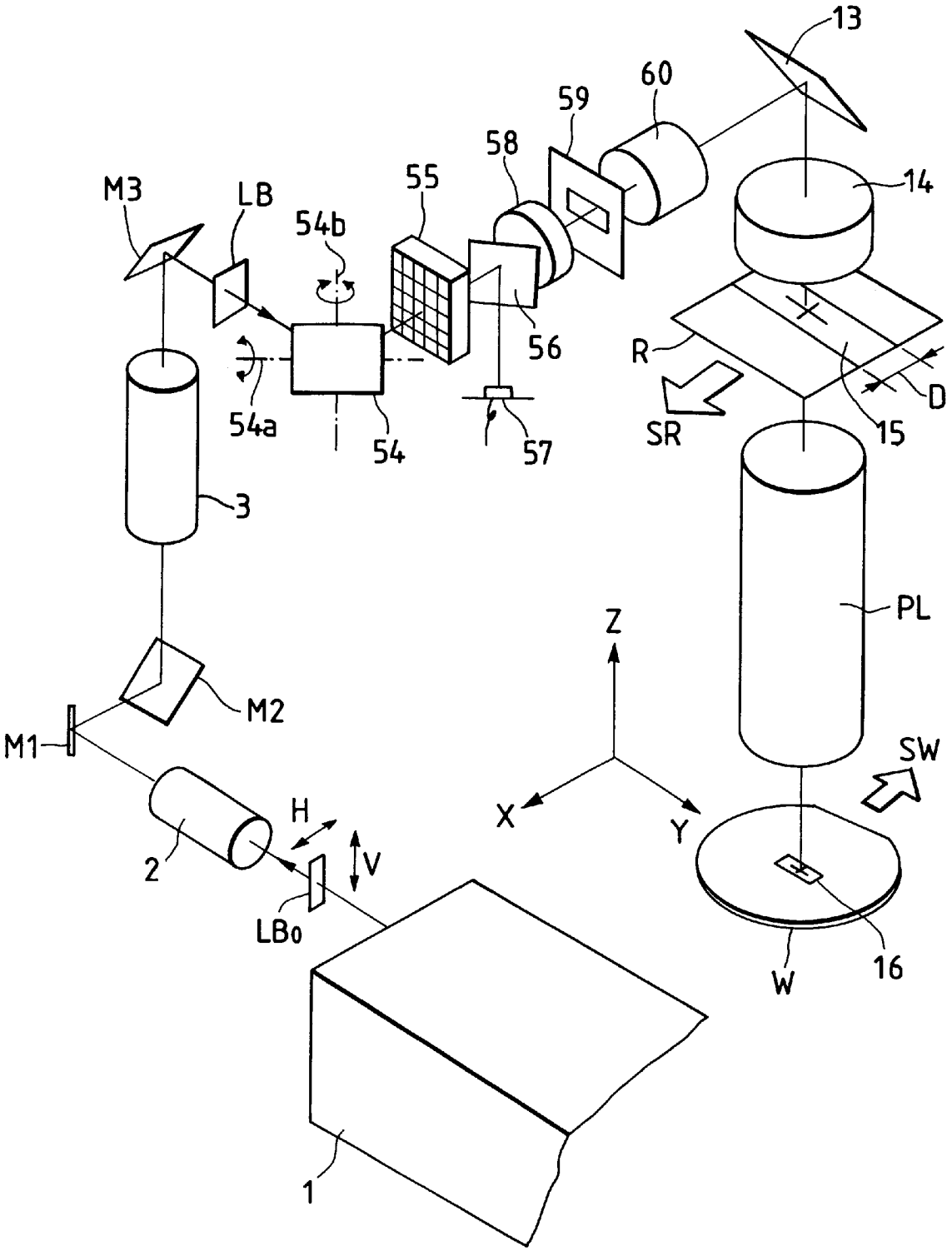
FIG. 7 is a perspective view showing the arrangement of a projection exposure apparatus according to the second embodiment of the present invention.

The second embodiment of the present invention will be described below with reference to FIG. 7. FIG. 7 shows the arrangement of a scanning projection exposure apparatus according to the embodiment comprising a pulse oscillation type laser light source. The same reference numerals in FIG. 7 denote parts having the same functions and effects as those in FIG. 1.

Referring to FIG. 7, a laser beam $LB_0$ in a far (or deep) ultraviolet range (e.g., a wavelength of 248 nm) emitted from an excimer laser light source 1 is incident on a beam shaping optical system 2 including cylindrical lenses. In general, the sectional shape of the laser beam $LB_0$ emitted from the excimer laser light source 1 is an elongated rectangular shape in which the dimension in the horizontal direction (H direction) is considerably smaller than that in the vertical direction (V direction). The beam shaping optical system 2 shapes the laser beam $LB_0$ into a beam which has a square section with an aspect ratio of 1 : 1, and outputs the shaped beam.

The laser beam emerging from the beam shaping optical system 2 is deflected by mirrors M1 and M2 and is incident on a beam expander 3, so that its sectional dimension is expanded to a predetermined value. A collimated laser beam LB emerging from the beam expander 3 is reflected by a mirror M3, and thereafter, its optical path is deflected by a pivot mirror (phase modulator for interference fringes) 54. The pivot mirror 54 is supported to be allowed to independently oscillate in two directions to have two orthogonal axes 54a and 54b as rotation axes, and two motors (not shown) for oscillating the pivot mirrors 54 about the two pivot axes 54a and 54b suitably arranged.

Figure 8:
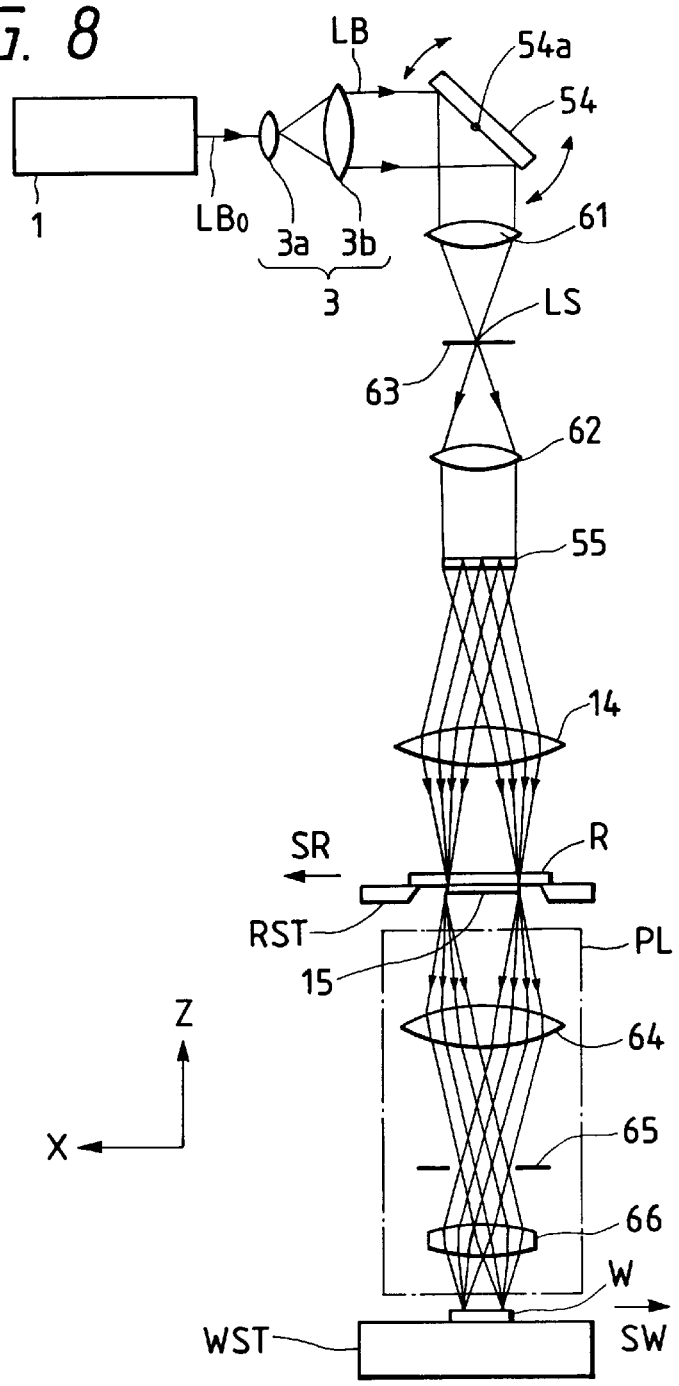
FIG. 8 is a view for explaining the control principle of a pivot mirror.

The laser beam reflected by the pivot mirror 54 is incident on an optical integrator (fly-eye lens) 55 via a field lens 61 and an input lens 62 (not shown in FIG. 7), which are shown in FIG. 8. The fly-eye lens 55 is constituted by aligning small lens elements each with a rectangular section in the vertical and horizontal directions to be in tight contact with each other, and a large number of light source images (secondary light sources) are formed at the rear-side (reticle-side) focal plane of the fly-eye lens 55. Some of laser beams diverging from the large number of light source images are reflected by a beam splitter 56, and are then incident on a photoelectric detector (integrator sensor) 57 via a focusing optical system (not shown).

The laser beams transmitted through the beam splitter 56 are focused by a first relay lens 58 on a reticle blind (field stop) 59 arranged in a plane substantially conjugate with the pattern formation surface of a reticle R. Therefore, the shape of an illumination area 15 on the reticle R is determined by the aperture shape of the reticle blind 59. In this embodiment, the shape of the illumination area 15 is a rectangular shape having a dimension D in its short-side direction (scanning direction SR). The laser beams passing through the aperture of the reticle blind 59 are incident on only a portion (illumination area 15) in a pattern area on the reticle R via a second relay lens 60, a mirror 13, and a condenser lens 14. More specifically, the laser beams from the large number of light source images formed by the fly-eye lens 55 illuminate the illumination area 15, with the dimension D in the short-side direction on the reticle R, to be superposed on each other via the condenser lens 14. An image of a pattern in the illumination area 15 is imaged and projected in a rectangular exposure area 16 on a wafer W via a projection optical system PL. Note that interference fringes are formed in the illumination area 15 in accordance with the arrangement of light source images in the rear-side focal plane of the fly-eye lens 55, and the following description will be given under an assumption that interference fringes are formed along the X and Y directions.

The control method of the pivot mirror 54 will be described in detail below. FIG. 8 is a diagram for explaining the basic principle of control. FIG. 8 shows only the principal members in FIG. 7, and the X-axis, i.e., the axis of scanning directions SR and SW, is defined to be parallel to the plane of the drawing of FIG. 8. A case will be examined below wherein the pivot mirror 54 is driven to one-dimensionally scan the interference fringes in the scanning direction only.

Referring to FIG. 8, a laser beam LB emerging from the beam expander 3 consisting of lens elements 3a and 3b is reflected by the pivot mirror 54 which is pivotal at high speed about the axis 54a perpendicular to the plane of the drawing of FIG. 8. The beam is thereafter focused on a plane 63 by the field lens 61, thus forming an equivalent light source LS on the plane 63. A laser beam from the equivalent light source LS is incident on the fly-eye lens 55 via the input lens 62. Furthermore, laser beams from the large number of light source images formed on the rear-side focal plane of the fly-eye lens 55 illuminate the illumination area 15 on the reticle R to be superposed on each other via the condenser lens 14.

The reticle R is held on a reticle stage RST, and the reticle stage RST scans the reticle R with respect to the illumination area 15 at a predetermined speed in the direction SR or in an opposite direction. On the other hand, the wafer W is placed on a wafer stage WST, and the wafer stage WST sequentially sets an end portion of each shot area on the wafer W within the image field of the projection optical system PL by a stepping operation. More specifically, the wafer stage WST sets each shot area at a predetermined approach (acceleration) start position in a rectangular coordinate system XY, and thereafter scans the wafer W at a predetermined speed in the direction SW or in an opposite direction in synchronism with the scanning operation of the reticle stage RST. The projection optical system PL is constituted by a front-group lens system 64, an aperture stop 65, and a rear-group lens system 66. Note that the aperture stop 65 is arranged on the pupil plane of the projection optical system, and defines the numerical aperture (NA) of the optical system.

In this embodiment, since the pivot mirror 54 is pivoted, i.e., oscillated about the shaft 54a, the equivalent light source LS on the plane 63 is caused to have a predetermined size as a time average, thus achieving incoherency on the illumination area 15. Since the excimer laser light source 1 has a very high directivity, the intensity distribution of the equivalent light source LS at a given timing can be processed as a $\delta$ function having a sharp peak at only a given point. On the other hand, when the pivot mirror 54 stands still, interference fringes at a pitch P are formed on the pattern formation surface of the reticle R by interference among the light of the large number of lens elements of the fly-eye lens 55. In this case, if $\lambda$ represents the wavelength (exposure wavelength) of the laser beam LB, $P_s$ represents the lens element interval of the fly-eye lens 55 in the scanning direction, $f_c$ represents the focal length of the first relay lens 58, and $\alpha$ represents the magnification of an optical system (60, 14) arranged between the reticle blind 59 and the reticle R, the pitch P of the interference fringes is given by:

$$P=(\lambda f_c/P_s)\alpha \quad (1)$$

Figure 9:
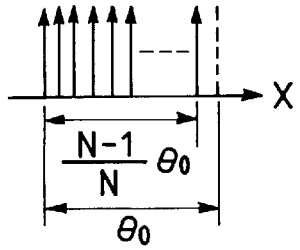
FIG. 9 is an explanatory view of the principle of an interference fringe reduction method using a pivot mirror.
Figure 10:
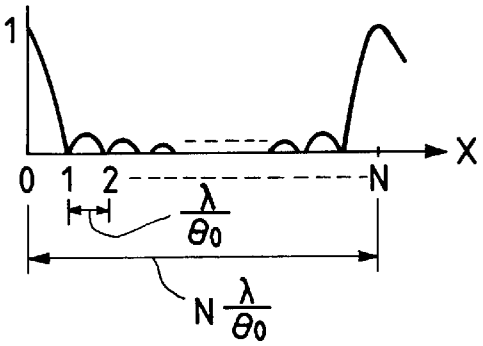
FIG. 10 is a graph showing the residual contrast in the case of FIG. 9.

Next, assume that the pivot mirror 54 is oscillated under a condition that the pivoting angle of the pivot mirror 54 between pulse emissions is $\theta_0$ and the number of exposure pulses on one shot area is N pulses not in the scanning exposure method but in a conventional still exposure method (stepper method), as shown in FIG. 9. Note that the pivoting angle $\theta_0$ represents the size of the equivalent light source LS between pulse emissions, and when the pivoting angle of the pivot mirror 54 is small, the pivoting angle $\theta_0$ and the actual pivoting angle have a correlation therebetween. After radiation of N shots of pulse light, the contrast of the accumulated light amount distribution on the wafer W is expressed by the square of a Fourier transform of the distribution of the equivalent light source shown in FIG. 9. FIG. 10 shows the contrast of the accumulated light amount distribution on the wafer W corresponding to FIG. 9. In FIG. 10, the contrast of the interference fringes obtained when the reticle R and the wafer W stand still and only one light pulse is emitted is set to be "1".

In this embodiment, as the exposure amount control method in the scanning exposure apparatus, the following method will be examined. Also, light amount unevenness on the reticle R will be examined below. The dimension, in the short-side direction (scanning direction SR), of the illumination area 15 on the reticle R in FIG. 7 is D, and the dimension D is measured by a technique of, e.g., multiplying a length obtained, in advance, by scanning a photoelectric conversion element on the wafer stage on the image plane with the reciprocal ($1/\beta$) of a projection magnification D of the projection optical system PL.

Assume that the number of exposure pulses for an arbitrary point in the illumination area 15 on the reticle R is represented by N. The number N of exposure pulses is calculated based on the proper exposure amount of the wafer W and the energy amount per pulse of the laser beam. During scanning exposure, the reticle stage RST moves by D/N along the scanning direction SR until the next pulse is radiated. If the variation (standard deviation $\sigma$ or $3\sigma$) of the energy amount e per pulse of the laser beam is represented by $\delta e$, and the average value of the pulse energy e is represented by E, the variation in pulse energy is normalized to $\delta e/E$. If the reproducibility (exposure amount control accuracy) of the proper exposure amount is represented by A, the number N of exposure pulses has the following lower limit $N_{min}$:

$$N \geqq N_{min} \geqq \{(\delta e/E)/A\}^2 \quad (2)$$

If the pulse energy e of the laser beam is large and the number N of exposure pulses becomes equal to or smaller than $N_{min}$, the condition given by relation (2) is satisfied by inserting a light attenuation member such as an ND filter in the optical path of the laser beam LB (or $LB_0$). When the number N of exposure pulses is determined in this manner, the reticle R moves by D/N in the scanning direction SR for each pulse emission. This moving amount corresponds to D/(NP) (unit: the number of cycles of interference fringes) if the pitch P (determined by equation (1)) of the interference fringes is used as a unit, and the moving amount is equivalent to a state wherein the interference fringes are shifted by D/(NP) (cycles) on the reticle R in the scanning direction SR during scanning exposure, even when the pivot mirror 54 stands still. In the following description, the pivoting angle of the pivot mirror 54 is expressed in units of the moving amount of interference fringes (the number of cycles of moving interference fringes) on the reticle R. Also, in the following description, assume that the pivoting angle of the mirror and the moving amount of interference fringes on the reticle R have a correlation therebetween.

Figure 11:
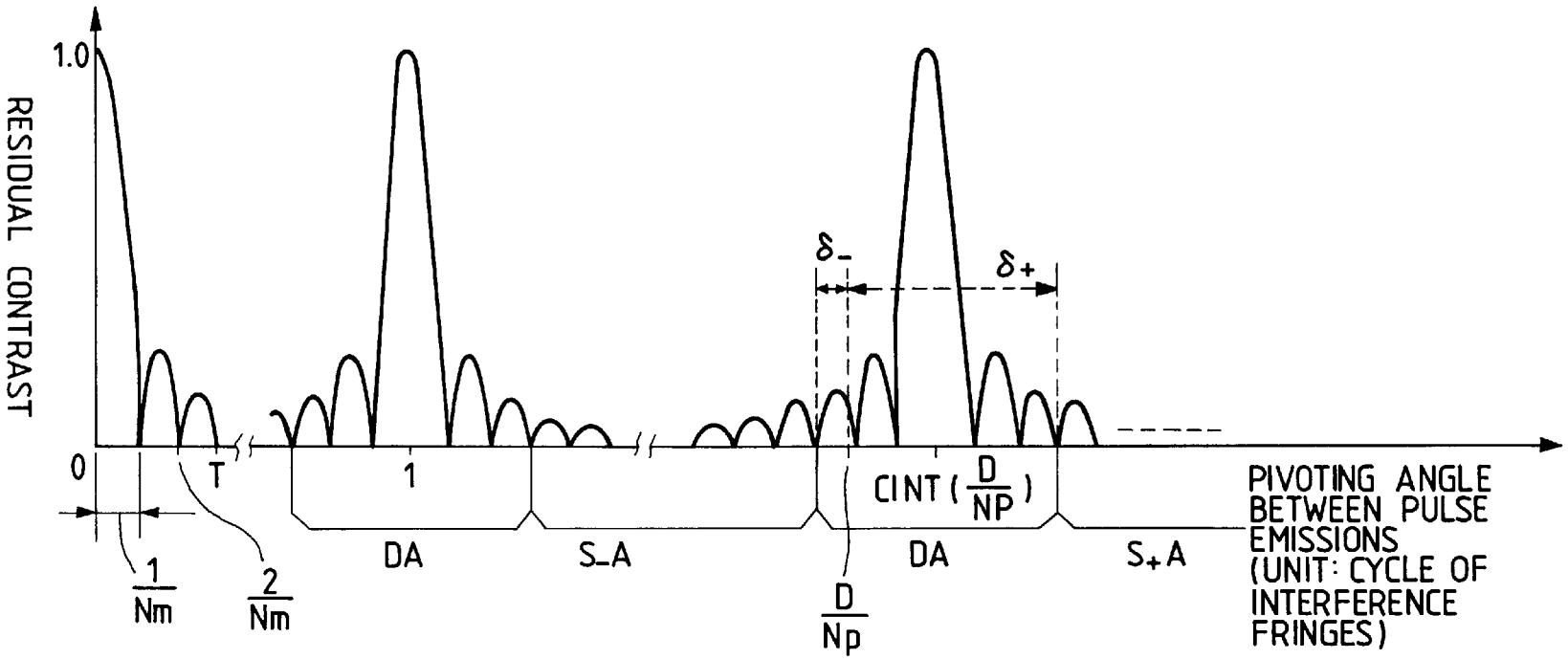
FIG. 11 is a graph showing the residual contrast, in the scanning direction, of the accumulated exposure amount obtained by scanning exposure of the second embodiment.

FIG. 11 shows the contrast (residual contrast) of interference fringes after accumulation exposure is performed using Nm shots of pulse light in this embodiment, in correspondence with FIG. 10. In FIG. 11, the pivoting angle pitch (pivoting angle between emissions) of the pivot mirror 54 in units of cycles of interference fringes is plotted along the abscissa, and the residual contrast is plotted along the ordinate. The number $N_m$ of pulses represents the number of exposure pulses within a half cycle of the pivot cycle of the pivot mirror 54 (the details will be described later). In this case, since each position where the value plotted along the abscissa is an integer corresponds to a case wherein interference fringes are shifted by integer cycles and are superposed on each other, the residual contrast assumes 1 as a maximum value, and small peaks whose positions are determined by an integer $N_m$ continuously appear around the maximum peak. In this embodiment, the movement of interference fringes on the reticle R upon driving of the reticle stage during scanning exposure is also equivalently processed as a result of pivoting the pivot mirror 54. More specifically, with the number N of exposure pulses, it is assumed that a pivoting angle offset D/(NP) is added to the pivoting angle in FIG. 11 even when the pivot mirror 54 stands still in practice.

As can be seen from FIG. 11, when the pivoting angle offset D/(NP) assumes an integer or a numerical value very close to an integer, if the pivot mirror 54 is kept inactive, interference fringes with a high contrast remain after the accumulation exposure using $N_m$ shots of pulse light. To prevent this, in this embodiment, the residual contrast is controlled to fall within a safe area $S_+A$ or a safe area $S_-A$ in FIG. 11 by the pivot control of the pivot mirror 54. More specifically, each of the safe areas $S_+A$ and $S_-A$ corresponds to an area where the residual contrast value becomes equal to or smaller than a predetermined value, and in FIG. 11, areas excluding five peaks having the maximum peak at the central position are respectively the safe areas $S_+A$ and $S_-A$. Areas other than the safe areas $S_+A$ and $S_-A$ on the abscissa in FIG. 11 are danger areas DA where the residual contrast is high, and light amount unevenness may exceed an allowable value.

In practice, the setting method of the safe areas $S_+A$ and $S_-A$ is determined on the basis of the characteristics of a laser light source to be used, the photosensitive characteristics of a photoresist to be coated on the wafer W, the allowable value of light amount unevenness, and the like. Normally, these areas can be set assuming the worst conditions. Referring to FIG. 11, the control method of the pivot mirror 54 in FIG. 8 is classified into the following two cases.

[When pivot mirror 54 is driven (condition A)]

When the pivoting angle offset D/(NP) falls within a danger area DA, the pivot mirror 54 is controlled, so that $\{D/(NP)\pm\delta\}$ (where $\delta$ is the pivoting angle (pivoting pitch) between pulse emissions of the pivot mirror 54) falls within, e.g., a safe area $S_+A$. Note that the signs ± of the pivoting angle 6 have the following meanings. The sign + indicates that the scanning direction of the reticle R is the same as the moving direction of interference fringes by the pivot mirror 54, and the sign − indicates that the two directions are opposite to each other.

In the example shown in FIG. 11, if the interval between the pivoting angle offset D/(NP) and the safe area $S_-A$ is represented by $\delta_-$ (negative value) and the interval between the pivoting angle offset D/(NP) and the safe area $S_+A$ is represented by $\delta_+$ (positive value), $|\delta_+|>|\delta_-|$ is satisfied. Therefore, if a larger one of values a and b is expressed by max(a, b), the pivoting angle $\delta$ of the pivot mirror 54 is given by the following equation:

$$\delta=\max(|\delta_+|, |\delta_-|)=|\delta_+| \tag{3}$$

[When pivot mirror 54 can be kept inactive (condition B)]

When the pivoting angle offset D/NP falls within the safe area $S_+A$ or $S_-A$, the pivot mirror 54 need not be pivoted.

Four conditions upon transfer of an image of a pattern on the reticle R onto the wafer W by the scanning exposure method in this embodiment will be explained below.

First condition

An arbitrary point in the illumination area 15 on the reticle R must be illuminated with light from the equivalent light source LS (see FIG. 8) having the same size.

Second condition

If the pivot cycle of the full stroke of the pivot mirror 54 is represented by $T_M$, the number of exposure pulses in a half cycle for an arbitrary point in the illumination area 15 must be determined, so that the arbitrary point is illuminated for a time corresponding to an integer multiple of the half cycle ($T_M/2$). With this condition, even when a control method for reciprocally moving the pivot mirror 54 is adopted, interference fringes can be shifted for a time corresponding to an integer multiple of the half cycle ($T_M/2$) upon illumination of all the points on the reticle R.

Third condition

In order to lower the residual contrast of interference fringes after scanning exposure on the reticle R (or the wafer W), it is desirable that the number of exposure pulses in the half cycle of the pivot mirror 54 be as large as possible to enhance the integration effect.

Fourth condition

When a piezoelectric element or the like is used as a driver for the pivot mirror 54, the pivoting angle $\delta$ of the mirror 54 between pulse emissions has a predetermined resolution. For example, in the case shown in FIG. 11, since a minimum value of the pivoting angle between pulse emissions is $3/N_m$, the maximum number of exposure pulses in the half cycle must be determined so that the minimum value becomes equal to or larger than the resolution of the pivoting angle of the pivot mirror 54.

Figure 12:
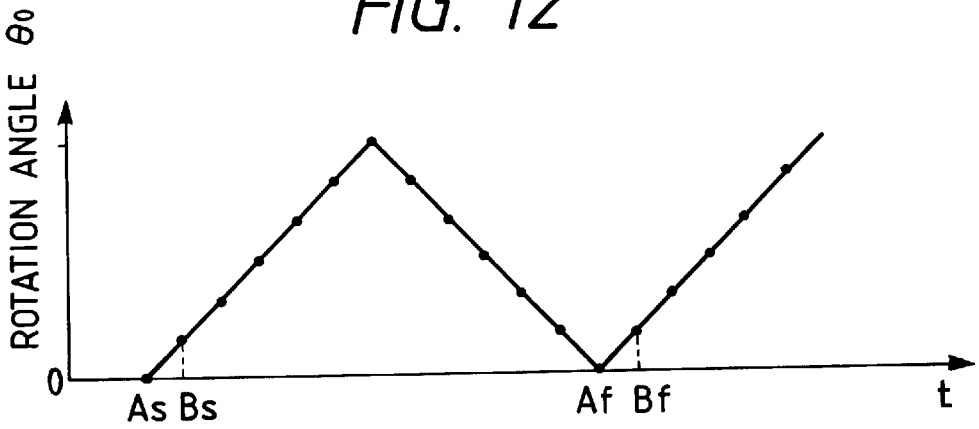
FIG. 12 is a graph showing an example of a control method of the pivot mirror in the second embodiment.
Figure 13:
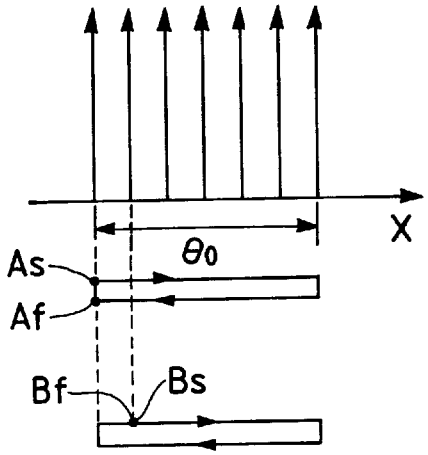
FIG. 13 is a view showing the distribution state of an equivalent light source in correspondence with FIG. 12.
Figure 14:
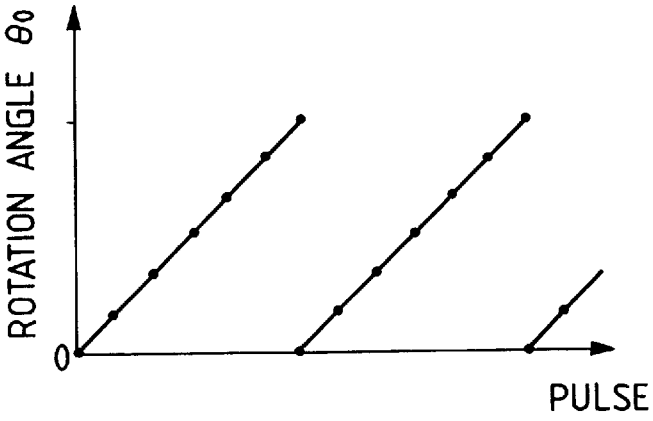
FIG. 14 is a graph showing another example of the control method of the pivot mirror in the second embodiment.

In consideration of the above-mentioned conditions, the control sequence of the pivot mirror 54 in this embodiment is determined. FIGS. 12 to 14 show an example of the control sequence. At a point A in a shot area on the wafer W, when viewed from the pivot mirror 54 in FIG. 7, exposure starts at a point $A_s$, and after the pivoting angle changes by one cycle in a triangular wave pattern having an amplitude $\theta_0$, the exposure ends at a point $A_f$. At a point B slightly shifted from the point A in the scanning direction, when viewed from the pivot mirror 54, exposure starts at a point $B_s$, and ends at a point $B_f$ after the pivoting angle changes by one cycle. More specifically, both the points A and B are exposed while the pivoting angle of the pivot mirror 54 changes by one cycle with the full stroke $\theta_0$.

FIG. 13 shows the movement of the equivalent light source LS in FIG. 8 in correspondence with FIG. 12. As shown in FIG. 13, the equivalent light source LS moves to cyclically oscillate with the full stroke $\theta_0$ along the X-axis. In association with this movement, for the point A on the wafer W, the equivalent light source LS moves by one cycle from the point $A_s$ to the point $A_f$, and for the point B on the wafer W, the equivalent light source LS moves by one cycle from the point $B_s$ to the point $B_f$.

An example of the scanning exposure operation in this embodiment will be described below with reference to FIG. 15. Of minimum numbers of exposure pulses which satisfy relation (2), even numbers are represented by $N_{min}$. Furthermore, from the above-mentioned first condition, the minimum number $N_{m,min}$ of exposure pulses in the half cycle ($T_M/2$) of the pivotal motion of the pivot mirror 54 is given by:

$$N_{m,min}=N_{min}/2 \tag{4}$$

From the above-mentioned fourth condition, the maximum number of exposure pulses in the half cycle of the pivotal motion of the pivot mirror 54 is represented by $N_{m,max}$. In step 101 in FIG. 15, the number N of exposure pulses per point on the wafer W is determined to satisfy relation (2). In step 102, the number $N_m$ of exposure pulses in the half cycle of the pivotal motion of the pivot mirror 54 is determined. The number $N_m$ of exposure pulses satisfies the following condition:

$$N_{min}/2\leqq N_m\leqq N_{m,max} \tag{5}$$

Therefore, if $N_{min}/2\leqq N_m\leqq N_{m,max}$ is satisfied, the number $N_m$ of exposure pulses is given by the following equation (step 103) (int(a) represents the integral part of a real number a):

$$N_m=\mathrm{int}(N/2) \tag{6}$$

On the other hand, if $2N_{m,max}\leqq N$, the number $N_m$ of exposure pulses is given by the following equation (step 104):

$$N_m=\text{int}[N/\{\text{int}(N/N_{m,max})+1\}] \quad (7)$$

In this manner, the first to fourth conditions are satisfied. After execution of step 103 or 104, the flow advances to step 105 to check if drive control of the pivot mirror 54 is to be executed. In this case, the safe areas of the pivoting angle of the pivot mirror 54 are assumed to be the safe areas $S_+A$ and S_A in FIG. 11. If CINT(a) represents an integer closest to a real number a, i.e., an integer obtained by rounding the first digit below the decimal point of the real number a, the pivot control of the pivot mirror 54 is performed when $|D/(NP)-CINT(D/(DP))|$ as a shift amount from a position corresponding to the maximum residual contrast is smaller than $3/N_m$ as an allowable value. More specifically, when the following inequality is satisfied, the flow advances to step 107:

$$|(D/(NP)-CINT(D/(DP))|<3/N_m \quad (8)$$

On the other hand, if inequality (8) is not satisfied, the flow advances to step 106, and scanning exposure is performed while the pivot mirror 54 stands still. In this case, the above-mentioned condition B is used.

In step 107, the pivoting angle (pivoting angle pitch) δ per pulse of the pivot mirror 54 is calculated from the following equation using the above-mentioned condition A:

$$\delta=\max(|CINT(D/(NP))-D/(NP)-3/N_m|, |CINT(D/(NP))-D/(NP)+3/N_m|) \quad (9)$$

In step 108, the full stroke $\theta_0$ of the pivoting angle of the pivot mirror 54 is calculated from the following equation using the pivoting angle pitch δ and the number $N_m$ of exposure pulses of the half cycle:

$$\theta_0=\delta.N_m \quad (10)$$

As described above, the control variables for the pivot mirror 54 are calculated. Thereafter, pulse emission is triggered in step 109, and the pivoting angle of the pivot mirror 54 is controlled on the basis of the calculated control variables in step 111. Thereafter, steps 109 to 111 are repetitively executed, and if it is determined in step 110 that scanning exposure on the entire surface of one shot area on the wafer W is finished, the exposure operation ends. Also, scanning exposure is performed on other shot areas on the wafer W in the same sequence as described above.

Referring back to FIG. 7, a method of moving interference fringes in the non-scanning direction (Y direction) on the reticle R will be described below. As described above, in the scanning direction, the pivot mirror 54 need not always be driven, depending on conditions such as the proper exposure amount of the wafer W, and the like. However, in the non-scanning direction, since the reticle R stands still, it is desirable to shift the interference fringes in the non-scanning direction via the pivot mirror 54 or another scanning member.

In the non-scanning direction, the pivot mirror 54 can be pivoted in the same manner as the conventional still exposure method (stepper method). In the non-scanning direction, although the residual contrast shown in FIG. 11 remains on the reticle R, there is no pivoting angle offset of the pivot mirror 54 determined by a proper exposure amount, unlike in the scanning direction. Therefore, the pitch and full stroke of the pivoting angle of the pivot mirror 54 will not change depending on the proper exposure amount. Also, in place of the concept of target safe areas in the scanning direction, a target point can be considered. More specifically, since the pivoting angle offset is 0, a pivoting angle which has a point T where the residual contrast becomes 0 as a target point in FIG. 11 is assumed. Then, the pivoting angle of the pivot mirror 54 is controlled, so that the pivoting angle (pivoting angle pitch) between pulse emissions of the pivot mirror 54 corresponds to $3/N_m$ and the full stroke $\theta_0$ corresponds to three pitches of the interference fringes on the reticle R. In addition, the number $N_m$ of exposure pulses in the half cycle of the pivotal motion of the pivot mirror 54 need only satisfy the following condition:

$$N_m=\text{int}(N/\text{int}(N/N_{min})) \quad (11)$$

Note that the target point like the point T in FIG. 11 is determined depending on the control accuracy of the pivot mirror 54 and the spatial coherency of a laser beam in the non-scanning direction.

As described above, in this embodiment, the pitch and stroke of the pivoting angle of the pivot mirror 54 and the number of exposure pulses in the half cycle are changed in accordance with the number N of pulses for one point in the shot area on the wafer W in the scanning direction, but the pitch and stroke of the pivoting angle are left unchanged in the non-scanning direction. As described above, the pivot mirror 54 is controlled by different methods in the scanning and non-scanning directions. In this embodiment, a case has been examined wherein the pivot mirror 54 is reciprocally moved during scanning exposure for one shot. Alternatively, a control method for pivoting the pivot mirror 4 in only one direction is also available.

FIG. 14 shows a case wherein the pivot mirror 54 is pivoted in one direction. In FIG. 13, the pivot mirror 54 is pivoted at the same angular velocities in both the forward and backward paths by contrast, in FIG. 14, an operation for pivoting the pivot mirror in, e.g., the forward path in the same manner as in FIG. 13, and returning the mirror to an initial position at high speed in the backward path is repeated, so that interference fringes are always shifted in only a predetermined direction. If the pivot mirror 54 is constituted, by e.g., a polygonal mirror, the operation shown in FIG. 14 can be realized by setting a constant rotation direction of the polygonal mirror.

When the pivot mirror 54 is pivoted in one direction in this manner, if the pivoting angle offset is D/(NP) in FIG. 11, the target area is set to be the safe area S_A. More specifically, in this case, the pivoting angle pitch δ is given by the following equation:

$$\delta=\delta_-=CINT(D/(NP))-D/(NP)-3/N_m \quad (12)$$

The pivoting direction of the pivot mirror 54 is a direction in which the interference fringes move in a direction opposite to the scanning direction SR of the reticle stage. In this case, the number $N_m$ of pulses in the half cycle of the pivotal motion of the pivot mirror 54 is classified as follows.

When $N_{min} \leqq N \leqq N_{m,max}$, $N_m$ is given by:

$$N_m=\text{int}(N/\text{int}(N/N_{min})) \quad (13)$$

On the other hand, when $N_{m,max}<N$, $N_m$ is given by:

$$N_m=\text{int}[N/\{\text{int}(N/N_{m,max})+1\}] \quad (14)$$

Thus, the full stroke $\theta_0$ of the pivoting angle of the pivot mirror 54 is given by:

$$\theta_0=\delta.N_m \quad (15)$$

Figure 15:
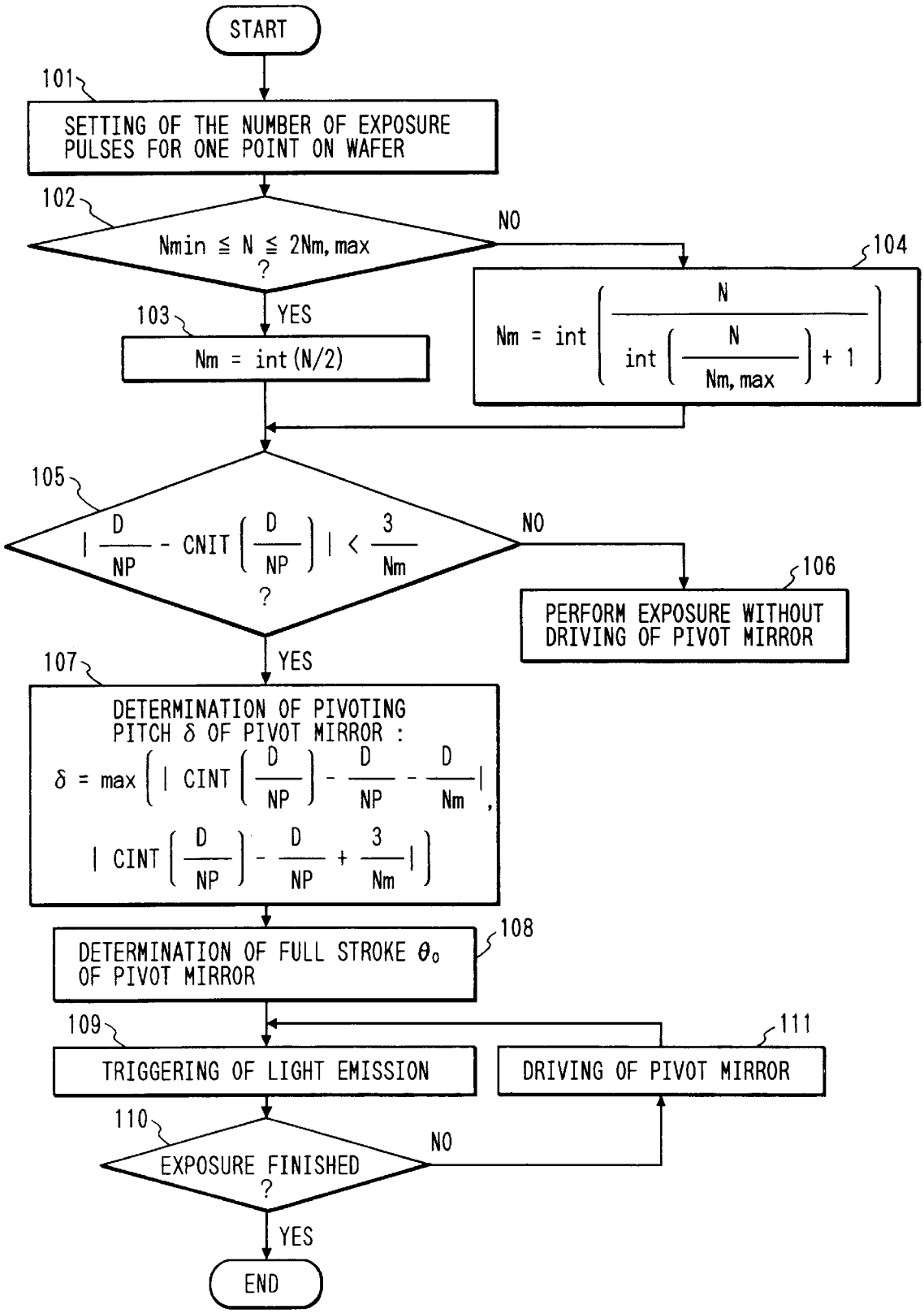
FIG. 15 is a flow chart showing an example of an exposure operation in the second embodiment.

In this method, selection of the pivoting angle $\delta$ in step 107 in FIG. 15 is not required, and the maximum full stroke $\theta_0$ required for the pivot mirror 54 can be half that of the method for reciprocally moving the mirror.

In this embodiment, the direction corresponding to a higher coherency can be caused to coincide with the scanning direction SR as in the first embodiment. Light amount unevenness in the scanning direction can be decreased, and the contrast of exposure amount unevenness in the non-scanning direction can also be decreased.

The present invention is not limited to the above embodiments. For example, when continuous light such as harmonics of a YAG laser, an emission line (i-line or the like) of a mercury lamp, or the like is used, suitable arrangements can be achieved without departing from the scope of the present invention.

What is claimed is:

1. A scanning exposure apparatus comprising:

a light source for emitting a spatially coherent light beam;

an illumination optical system for radiating the light beam from said light source onto a mask so as to form an illumination area on a local area of the mask, said light beam having higher spatial coherence in one direction than in another direction of a cross-section of the beam in the illumination area; and a device for synchronously moving the mask and a photosensitive substrate so as to transfer a pattern formed on the mask onto the photosensitive substrate, wherein a direction of relative scanning of the illumination area and the mask upon movement of the mask substantially coincides with the direction with higher spatial coherence of the light beam.

2. An apparatus according to claim 1, wherein said light source comprises a pulse oscillation type laser light source for emitting a light beam in a deep ultraviolet range.

3. An apparatus according to claim 1, further comprising:

a projection optical system for projecting an image of the pattern in the illumination area onto photosensitive substrate, wherein said moving device comprises a mask stage which holds the mask to be substantially perpendicular to an optical axis of said projection optical system, and moves substantially along the direction with the higher spatial coherence of the light beam, and a substrate stage which holds the photosensitive substrate and moves in a direction substantially perpendicular to the optical axis of said projection optical system.

4. An apparatus according to claim 1, further comprising:

an optical member for receiving the light beam from said light source, and shifting an interference pattern formed in the illumination area in a direction substantially perpendicular to the direction of relative scanning.

5. An apparatus according to claim 4, wherein said illumination optical system comprises an optical integrator for receiving the light beam, and forming a plurality of light source images, and said optical member changes an incident angle of the light beam or said optical integrator.

6. An apparatus according to claim 1, further comprising:

a device for shifting an interference pattern in the illumination area along the direction of relative scanning in accordance with a moving speed of the mask and an intensity distribution, in the direction of relative scanning, of the interference pattern.

7. An apparatus according to claim 6, further comprising:

a device for detecting spatial coherence of the light beam by receiving at least a portion of the light beam from said light source; and a controller for controlling an operation of said shifting device in accordance with the detected spatial coherence.

8. A scanning exposure apparatus comprising:

a light source for emitting a spatially coherent light beam;

an illumination optical system for radiating the light beam from said light source onto a mask so as to form an illumination area on a local area of the mask;

a device for synchronously moving the mask and a photosensitive substrate so as to transfer a pattern formed on the mask onto the photosensitive substrate; and a device for shifting an interference pattern in the illumination area in accordance with a moving speed of the mask and an intensity distribution of the interference pattern while the mask and the photosensitive substrate are being synchronously moved.

9. An apparatus according to claim 8, wherein the light beam has higher spatial coherence in one direction than in another direction of a cross-section of the beam in the illumination area, said moving device comprises a mask stage which holds the mask and moves substantially along the direction with higher spatial coherence of the light beam, and a substrate stage which holds the photosensitive substrate and is movable in synchronism with movement of said mask stage.

10. An apparatus according to claim 8, further comprising:

a device for detecting spatial coherence of the light beam by receiving at least a portion of the light beam from said light source; and a controller for controlling an operation of said shifting device in accordance with the detected spatial coherence.

11. A scanning exposure apparatus comprising:

a light source for emitting spatially coherent pulsed light;

an illumination optical system for radiating the light from said light source onto a mask so as to form an illumination area locally on the mask;

a device for synchronously moving the mask and a photosensitive substrate so as to transfer a pattern formed on the mask onto the photosensitive substrate; and a device for shifting an interference pattern formed in the illumination area in a moving direction of the mask, wherein an accumulated light amount on the mask or the photosensitive substrate, upon radiation of a plurality of light pulses from said light source onto said mask, is uniformed by operation of said moving device and said shifting device.

12. An apparatus according to claim 11, wherein said shifting device comprises an optical member for receiving light pulses from said light source and varying a propagation direction of the light pulses, and shifts the interference pattern in the illumination area in the moving direction of the mask and a direction substantially perpendicular to the moving direction.

13. A scanning exposure apparatus comprising:

a light source;

an illumination optical system for illuminating a mask with a light beam from said light source, said light beam having higher spatial coherence in one direction than in another direction of a cross-section of the beam in an illumination area on the mask;

a projection optical system for projecting an image of a pattern formed on the mask onto a photosensitive substrate;

a mask stage which holds the mask to be substantially perpendicular to an optical axis of said projection optical system, and which moves substantially along the direction with higher spatial coherence of the light beam;

a substrate stage which holds the photosensitive substrate and moves in a direction substantially perpendicular to the optical axis of said projection optical system; and a device for synchronously driving said mask stage and said substrate stage so as to transfer the pattern on the mask onto the photosensitive substrate.

14. An apparatus according to claim 13, further comprising:

a device for shifting an interference pattern formed on the mask in a moving direction of said mask stage or in a direction crossing the moving direction, in association with the movement of said mask stage.

15. A scanning exposure apparatus comprising:

a projection optical system for projecting an image of a pattern formed on a mask onto a photosensitive substrate;

a device for synchronously moving the mask and the photosensitive substrate along a direction substantially perpendicular to an optical axis of said projection optical system so as to transfer the pattern on the mask onto the photosensitive substrate; and a device for illuminating a local area on the mask with light beam having higher spatial coherence in one direction than in another direction of a cross-section of the beam, such that the direction with higher spatial coherence of the light beam substantially coincides with a moving direction of the mask.

16. An apparatus according to claim 15, wherein said illuminating device comprises a pulse laser light source for emitting the light beam, an optical member for substantially aligning the direction with higher spatial coherence of the light beam with the moving direction of the mask, a field stop arranged on a plane substantially conjugate with a pattern surface of the mask, and a light transmission system for guiding, to the mask, light which emerges from said optical member and passes through an aperture of said field stop.

17. An apparatus according to claim 16, further comprising:

a device for shifting an interference pattern formed on the mask in the moving direction of the mask or a direction crossing the moving direction.

18. An apparatus for illuminating a mask having a pattern to be transferred onto a photosensitive substrate by a scanning exposure method, comprising:

a light source;

a device for radiating the light beam from said light source onto the mask via an aperture of a field stop arranged on a plane substantially conjugate with a pattern surface of the mask, said light beam having higher spatial coherence in one direction than in another direction of a cross-section of the beam in an illumination area on the mask; and an optical member for substantially aligning the direction with higher spatial coherence of the light beam with a scanning direction of the mask.

*19. A scanning exposure method comprising:*

*radiating a spatially coherent light beam onto a mask so as to form an illumination area; and*

*synchronously moving the mask and a substrate so as to transfer a pattern formed on the mask onto the substrate; and*

*shifting an interference pattern formed in the illumination area in a moving direction of the mask.*

*20. A scanning exposure method comprising:*

*synchronously moving a mask and a substrate so as to transfer a pattern formed on the mask onto the substrate; and*

*illuminating the mask with a light beam having higher spatial coherence in one direction than in another direction of a cross-section of the beam, such that the direction with higher spatial coherence of the light beam substantially coincides with a moving direction of the mask.*

*21. A scanning exposure method comprising:*

*moving, during a scanning exposure, a mask and an object relative to an exposure beam to expose the object with a pattern formed on the mask; and*

*directing the exposure beam to an irradiation area during the scanning exposure, the mask moving relative to the irradiation area, in a scanning direction during the scanning exposure,*

*wherein the exposure beam has higher spatial coherence in one direction than in another direction, and wherein said one direction substantially coincides with the scanning direction.*

*22. A method according to claim 21, further comprising:*

*shifting an interference pattern formed in the irradiation area to which the exposure beam is directed.*

*23. A method according to claim 22, wherein the interference pattern is shifted in accordance with a relative velocity of said mask and said exposure beam.*

*24. A method according to claim 22, wherein the interference pattern is shifted in accordance with an intensity distribution of the interference pattern.*

*25. A method according to claim 22, wherein the interference pattern is shifted in the scanning direction.*

*26. A method according to claim 22, wherein the interference pattern is shifted in a direction transverse to the scanning direction.*

*27. A method according to claim 26, wherein said direction transverse to the scanning direction includes a direction perpendicular to the scanning direction.*

*28. A scanning exposure apparatus in which a work-piece is moved in a scanning direction relative to an exposure beam during a scanning exposure, comprising:*

*a projection system, disposed in a path of said exposure beam, which projects a pattern image onto the work-piece, the exposure beam having higher spatial coherence in one direction than in another direction; and* an optical system, disposed in the path of said exposure beam, which directs said exposure beam to said work-piece such that said one direction substantially coincides with the scanning direction.

29. A scanning exposure apparatus according to claim 28, further comprising:

a shifting member, disposed in the path of said exposure beam, which shifts an interference pattern formed in an irradiation area of the exposure beam during the scanning exposure.

30. An apparatus according to claim 29, wherein said shifting member shifts the interference pattern in the scanning direction.

31. An apparatus according to claim 29, wherein said shifting member shifts the interference pattern in a direction transverse to the scanning direction.

32. An apparatus according to claim 28, wherein said optical system includes an optical integrator.

33. A scanning exposure method comprising:

moving, during a scanning exposure, a mask and an object relative to an exposure beam to expose the object with a pattern formed on the mask;

directing the exposure beam to an irradiation area during the scanning exposure, the mask moving relative to the irradiation area in a scanning direction during the scanning exposure; and shifting an interference pattern formed in the irradiation area during the scanning exposure.

34. A method according to claim 33, wherein the interference pattern is shifted in the scanning direction.

35. A method according to claim 34, wherein the interference pattern is shifted in accordance with a relative velocity of said mask and said exposure beam.

36. A method according to claim 34, wherein said interference pattern is shifted in accordance with an intensity distribution of the interference pattern.

37. A scanning exposure method according to claim 33, wherein the following condition is satisfied:

$$V=(E/Ep)f\cdot D$$

where,

V: a relative velocity of said mask and said exposure beam;

E: an optimum exposure dose of said mask;

Ep: an average energy of said exposure beam;

D: a width of said irradiation area in the scanning direction;

f: an oscillation frequency of said exposure beam.

38. A method according to claim 33, wherein the interference pattern is shifted in a direction transverse to the scanning direction.

39. A method according to claim 38, wherein said direction transverse to the scanning direction includes a direction perpendicular to the scanning direction.

40. A method according to claim 33, wherein the exposure beam has higher spatial coherence in one direction than in another direction, and wherein the interference pattern is shifted in said one direction.

41. A method according to claim 40, wherein said one direction substantially coincides with the scanning direction.

42. A method according to claim 33, wherein the interference pattern has lower contrast in one direction than in another direction, and wherein the interference pattern is shifted in said one direction.

43. A method according to claim 42, wherein said one direction is transverse to the scanning direction.

44. A method according to claim 33, wherein the interference pattern has higher contrast in one direction than in another direction, and wherein the interference pattern is shifted in said one direction.

45. A method according to claim 44, wherein said one direction substantially coincides with the scanning direction.

46. A scanning exposure method in which a work-piece to be exposed and an exposure beam are moved relatively during scanning exposure, comprising:

determining an exposure condition of the work-piece based on information concerning a divergent angle of said exposure beam; and effecting scanning exposure based on the determined exposure condition.

47. A method according to claim 46, wherein said exposure beam is emitted from a beam source of a pulse-oscillation type, and said exposure condition is an oscillation cycle of the exposure beam during the scanning exposure.

48. A method according to claim 46, wherein said exposure beam is emitted from a beam source of a pulse-oscillation type, and said exposure condition is a number of pulses of the exposure beam with which said work-piece is irradiated.

49. A method according to claim 46, wherein said exposure condition is a shift condition of an interference pattern formed within an irradiation area of said exposure beam.

50. A method according to claim 46, wherein said exposure condition is a relative velocity of said exposure beam and said work-piece.

51. A scanning exposure method comprising:

moving a mask and an object synchronously to expose the object with a pattern formed on the mask during a scanning exposure; and directing a plurality of exposure beams to an irradiation area during the scanning exposure, the mask moving relative to the irradiation area in a scanning direction during the scanning exposure, wherein the plurality of exposure beams have illuminance distributions in the scanning direction that are different from each other.

52. A method according to claim 51, wherein said plurality of beams differ in their directions of polarization to each other.

53. A scanning exposure method comprising:

directing an exposure beam to an irradiation area;

relatively moving an object and the irradiation area for scanning exposure; and determining whether or not an interference pattern formed with said irradiation area is to be shifted during said scanning exposure.

54. A method according to claim 53, wherein whether or not the interference pattern is to be shifted is determined based on a relative velocity of said irradiation area and said object.

55. A method according to claim 53, wherein whether or not the interference pattern is to be shifted is determined based on an intensity distribution of the interference pattern.

56. A method according to claim 55, wherein whether or not the interference pattern is to be shifted is determined based on a value D/NP, wherein D: a width of said irradiation area in a direction of said relative moving;

*N: a number of pulses with which a point on said object is to be irradiated;*

*P: a pitch of said interference pattern.*

*57. A scanning exposure method comprising:*

*directing an exposure beam to an irradiation area;*

*relatively moving an object and the irradiation area in a first direction for scanning exposure; and*

*shifting an interference pattern formed within the irradiation area in a first direction and a second direction which is transverse to said first direction, during the scanning exposure;*

*wherein a way of controlling the shift of the interference pattern in said first direction is different from a way of controlling the shift of the interference pattern in said second direction.*

*58. A method of manufacturing a device using an object, comprising:*

*moving, during a scanning exposure, a mask and the object relative to an exposure beam to expose the object with a pattern formed on the mask; and*

*directing the exposure beam to an irradiation area during the scanning exposure, the mask moving relative to the irradiation area in a scanning direction during the scanning exposure,*

*wherein the exposure beam has higher spatial coherence in one direction than in another direction, and wherein said one direction substantially coincides with the scanning direction.*

*59. A method of manufacturing a device using a work-piece, comprising:*

*providing a scanning exposure apparatus in which a work-piece is moved in a scanning direction relative to an exposure beam during a scanning exposure, and in which a projection system and an optical system are disposed in the path of the exposure beam;*

*using the projection system to project a pattern image onto the work-piece, the exposure beam having higher spatial coherence in one direction than in another direction; and*

*using the optical system to direct the exposure beam to the work-piece such that said one direction substantially coincides with the scanning direction.*

*60. A method of manufacturing a device using an object, comprising:*

*moving, during a scanning exposure, a mask and the object relative to an exposure beam to expose the object with a pattern formed on the mask;*

*directing the exposure beam to an irradiation area during the scanning exposure, the mask moving relative to the irradiation area in a scanning direction during the scanning exposure; and*

*shifting an interference pattern formed in the irradiation area during the scanning exposure.*

* * * * *